United States Patent
Ngai et al.

(10) Patent No.: US 8,039,877 B2
(45) Date of Patent: Oct. 18, 2011

(54) (110)-ORIENTED P-CHANNEL TRENCH MOSFET HAVING HIGH-K GATE DIELECTRIC

(75) Inventors: Tat Ngai, Austin, TX (US); Qi Wang, Sandy, UT (US)

(73) Assignee: Fairchild Semiconductor Corporation, So. Portland, MA (US)

( * ) Notice: Subject to any disclaimer, the term of this patent is extended or adjusted under 35 U.S.C. 154(b) by 283 days.

(21) Appl. No.: 12/207,417

(22) Filed: Sep. 9, 2008

(65) Prior Publication Data
US 2010/0059797 A1    Mar. 11, 2010

(51) Int. Cl.
*H01L 29/04* (2006.01)
*H01L 29/78* (2006.01)

(52) U.S. Cl. ............... 257/255; 257/330; 257/E29.004; 257/E29.255

(58) Field of Classification Search .......... 257/255, 257/330, E29.004, E29.255
See application file for complete search history.

(56) References Cited

U.S. PATENT DOCUMENTS

| | | |
|---|---|---|
| 4,616,408 A | 10/1986 | Lloyd |
| 5,344,524 A | 9/1994 | Sharma et al. |
| 5,374,564 A | 12/1994 | Bruel |
| 5,391,257 A | 2/1995 | Sullivan et al. |
| 5,455,202 A | 10/1995 | Malloy et al. |
| 5,494,835 A | 2/1996 | Bruel |
| 5,528,058 A | 6/1996 | Pike et al. |
| 5,714,395 A | 2/1998 | Bruel |
| 5,811,348 A | 9/1998 | Matsushita et al. |
| 5,877,070 A | 3/1999 | Goesele et al. |
| 5,882,987 A | 3/1999 | Srikrishnan |
| 5,998,833 A | 12/1999 | Baliga |
| 6,033,489 A | 3/2000 | Marchant et al. |

(Continued)

FOREIGN PATENT DOCUMENTS
WO  WO 2006/058210 A1   6/2006

OTHER PUBLICATIONS

Bruel, M., "Silicon on Insulator Material Technology", *Electronics Letters*, Jul. 6, 1995, vol. 31, No. 14, pp. 1201-1202.

(Continued)

*Primary Examiner* — Victor Mandala
(74) *Attorney, Agent, or Firm* — Kilpatrick Townsend & Stockton LLP

(57) ABSTRACT

A method of forming a field effect transistor having a heavily doped p-type (110) semiconductor layer over a metal substrate starts with providing a heavily doped p-type (110) silicon layer, and forming a lightly doped p-type (110) silicon layer on the P heavily doped-type (110) silicon layer. The method also includes forming a p-channel MOSFET which has a channel region along a (110) crystalline plane in the lightly doped p-type (110) silicon layer to allow a current conduction in a <110> direction. The p-channel MOSFET also includes a gate dielectric layer having a high dielectric constant material lining the (110) crystalline plane. The method further includes forming a top conductor layer overlying the lightly doped p-type (110) silicon layer and a bottom conductor layer underlying the heavily doped p-type (110) silicon layer. A current conduction from the top conductor layer to the bottom conductor layer is characterized by a hole mobility along a <110> crystalline orientation and on a (110) crystalline plane.

25 Claims, 18 Drawing Sheets

U.S. PATENT DOCUMENTS

| | | | |
|---|---|---|---|
| 6,140,210 | A | 10/2000 | Aga et al. |
| 6,372,608 | B1 | 4/2002 | Shimoda et al. |
| 6,391,744 | B1 | 5/2002 | Hudak et al. |
| 6,392,290 | B1 | 5/2002 | Kasem et al. |
| 6,429,481 | B1 | 8/2002 | Mo et al. |
| 6,455,398 | B1 | 9/2002 | Fonstad et al. |
| 6,468,923 | B1 | 10/2002 | Yonehara et al. |
| 6,500,732 | B1 | 12/2002 | Henley et al. |
| 6,562,647 | B2 | 5/2003 | Zandman et al. |
| 6,635,534 | B2 | 10/2003 | Madson |
| 6,713,813 | B2 | 3/2004 | Marchant |
| 6,828,195 | B2 | 12/2004 | Mo et al. |
| 6,939,781 | B2 | 9/2005 | Redd et al. |
| 7,033,891 | B2 | 4/2006 | Wilson et al. |
| 7,052,974 | B2 | 5/2006 | Mitani et al. |
| 2002/0142548 | A1 | 10/2002 | Takaishi |
| 2003/0183876 | A1 | 10/2003 | Takafuji et al. |
| 2004/0036121 | A1 | 2/2004 | Aoki et al. |
| 2004/0140479 | A1 | 7/2004 | Akatsu |
| 2005/0017291 | A1 | 1/2005 | Hirler |
| 2005/0167742 | A1 | 8/2005 | Challa et al. |
| 2006/0108635 | A1 | 5/2006 | Bhalla et al. |
| 2006/0058210 | A1 | 6/2006 | Challa et al. |
| 2006/0214222 | A1 | 9/2006 | Challa et al. |
| 2006/0273386 | A1 | 12/2006 | Yilmaz et al. |
| 2007/0020884 | A1 | 1/2007 | Wang et al. |
| 2007/0032020 | A1 | 2/2007 | Grebs et al. |
| 2007/0190728 | A1 | 8/2007 | Sreekantham et al. |
| 2007/0262360 | A1 | 11/2007 | Pattanayak et al. |
| 2008/0261379 | A1 | 10/2008 | Jinbo et al. |
| 2009/0179259 | A1* | 7/2009 | Wang et al. .................. 257/330 |

OTHER PUBLICATIONS

Celler, C.K. et al., "Frontiers of silicon-on-insulator", *Journal of Applied Physics*, vol. 93, No. 9, pp. 4955-4978.

Green, M. L., "Nucleation and growth of atomic layer deposited $HfO_2$ gate dielectric layers on chemical oxide (Si-O-H) and thermal oxide ($SiO_2$ or Si-O-N) underlayers", *Journal of Applied Physics*, vol. 92, No. 12, Dec. 12, 2002, pp. 7168-7174.

International Search Report and Written Opinion of Dec. 12, 2008 for PCT Application No. PCT/US2008/77240, 12 pages.

Irie, H., et al., "In-Plane Modility Anisotropy and Universality Under Uni-axial Strains in n-and p-MOS Inversion Layers on (100), (110), and (111) Si", *IEEE*, pp. 9.5.1 to 9.5.4, 2004.

Sze, S.M., *Physics of Semiconductor Devices*, $2^{nd}$ Edition, John Wiley & Sons, Inc., New York, 1981, pp. 380-390.

Tong, Q.Y. et al., "Layer splitting process in hydrogen-implanted Si, Ge, SiC, and diamond substrates", Mar. 17, 1997, *Appl. Phys. Lett.*, vol. 70, No. 11, pp. 1390-1392.

Tong, Q.Y. et al., "Layer Transfer by Bonding and Layer Splitting", 1999, *Semiconductor Wafer Bonding: Science and Technology*, John Wiley & Sons, Inc., pp. 161-165.

International Search Report and Written Opinion corresponding to the PCT application No. PCT/US06/28270, date of mailing Jun. 13, 2007, 11 pages total.

Office Action for U.S. Appl. No. 11/189,163, dated Dec. 12, 2006.
Office Action for U.S. Appl. No. 11/189,163, dated Aug. 21, 2007.
Office Action for U.S. Appl. No. 11/189,163, dated Apr. 30, 2008.
Office Action for U.S. Appl. No. 11/189,163, dated Feb. 5, 2009.
Notice of Allowance for U.S. Appl. No. 11/189,163, dated Aug. 7, 2009.
Office Action for U.S. Appl. No. 12/614,824 dated Oct. 13, 2010.
Office Action for U.S. Appl. No. 12/614,824, dated Mar. 31, 2011.
First Office Action received from the State Intellectual Property Office of the People's Republic of China for Application No. 200880103707.8, dated Feb. 10, 2011, 33 pages total.

* cited by examiner

(110)-ORIENTED P-CHANNEL TRENCH MOSFET HAVING HIGH-K GATE DIELECTRIC

CROSS-REFERENCES TO RELATED APPLICATIONS

This application is related to U.S. patent application Ser. No. 12/174,030 filed Jul. 16, 2008, which is commonly assigned and incorporated herein by reference in its entirety for all purposes. This application is also related to U.S. patent application Ser. No. 11/189,163 filed Jul. 25, 2005, which is commonly assigned and incorporated herein by reference in its entirety for all purposes.

BACKGROUND OF THE INVENTION

The present invention relates in general to semiconductor devices, and more particularly to a method and structure for making trench FETs in (110)-oriented silicon on metal (SOM) substrates and having high dielectric constant (high k) gate dielectrics.

Conventional semiconductor manufacturing utilizes a number of processes to form semiconductor structures on substrates. In certain devices, the substrate is used as part of the current conduction path. For example, the substrate plays an important role with the solid state switch which is a key semiconductor structure used for discrete device applications and integrated circuits. Solid state switches include, for example, the power metal-oxide-semiconductor field effect transistor (power MOSFET), the insulated-gate bipolar transistor (IGBT), and various types of thyristors. Some of the defining performance characteristics for the power switch are its on-resistance (i.e., drain-to-source on-resistance, $R_{DSon}$), breakdown voltage, and switching speed.

Generally, the switching speed, on-resistance, breakdown voltage, and power dissipation of a typical MOSFET device may be influenced by the layout, dimensions, and materials. Industry design practice has sought to keep the on-resistance of the MOSFET as low as possible to lower conducting power loss and increase current densities. For example, in vertical power MOSFET devices, the on-resistance is composed of several resistances such as channel resistance, drift region (epitaxial layer) resistance, and substrate resistance. The on-resistance of such a vertical power MOSFET device (as well as other MOSFET devices) is directly influenced by the type and dimensions of materials used in the drain to source conduction path. Therefore, for a vertical power devices, such as a power MOSFET, the substrate is a critical performance element.

Additionally, the substrate can impact the property and quality of the gate dielectric in the MOSFET. Therefore, the method of forming the gate dielectric plays an important role in determining the performance and reliability of an MOSFET.

Even though conventional techniques have been used for making vertical power devices utilizing various substrate materials, there are limitations associated with these conventional techniques. Some of these limitations are discussed in detail below.

Thus, there is a need for improved techniques for making vertical devices having desirable substrate and dielectric properties while maintaining a simple manufacturing process.

BRIEF SUMMARY OF THE INVENTION

In accordance with embodiments of the invention, various techniques are described for forming vertical devices using p-type (110) oriented silicon material that provides increased hole mobility in current conduction on a (110) plane and in the <110> direction and heavily doped p-type regions for both reducing substrate resistance and forming a good ohmic contact. Additionally, a method for forming gate dielectric having high dielectric constant is also provided to obtain better quality on a (110) silicon surface compared to conventional thermal oxides. In one embodiment, a layer of heavily doped (110) silicon material is formed and then transferred to a support substrate. Following vertical device fabrication, the support substrate is replaced with a metal contact and support layer to the heavily doped (110) silicon material. In one variation of the invention, a layer of heavily doped (110) silicon material is formed on a lightly doped (110) silicon substrate. After device fabrication, the substrate is removed using a selective etching process after initial mechanical-grinding. Accordingly, embodiments of the invention combine higher hole mobility in the (110) p-type material, improved high k gate dielectric on the (110) surface, and low resistivity of heavily doped (110) p-type material to improve device properties of p-type vertical semiconductor devices.

According to an embodiment of the invention, a method is provided for forming a semiconductor device on a heavily doped p-type (110) semiconductor layer. The method starts with providing a heavily doped p-type (110) silicon layer, and forming a lightly doped p-type (110) silicon layer on the P heavily doped-type (110) silicon layer. The method also includes forming a p-channel MOSFET which has a channel region along a (110) crystalline plane in the lightly doped p-type (110) silicon layer to allow a current conduction in a <110> direction. The p-channel MOSFET also includes a gate dielectric layer having a high dielectric constant material lining the (110) crystalline plane. The method further includes forming a top conductor layer overlying the lightly doped p-type (110) silicon layer and a bottom conductor layer underlying the heavily doped p-type (110) silicon layer. Depending on the embodiment, the p-channel MOSFET can be a trench gate MOSFET, a shielded gate MOSFET, or a lateral MOSFET, etc. In each of these devices, a current conduction from the top conductor layer to the bottom conductor layer is characterized by a hole mobility along a <110> crystalline orientation and on a (110) crystalline plane. Methods for forming these devices are described in more details below.

In an embodiment, the heavily doped p-type (110) silicon layer overlying a first support substrate. After the top conductor is formed, the method includes bonding a second support substrate to the top conductor layer. Then the first support substrate is removed to expose a back surface of the heavily doped p-type (110) silicon layer, and the bottom conductor layer is formed in contact with the exposed back surface of the heavily doped p-type (110) silicon layer. Subsequently, the second support substrate is removed.

In one embodiment, the first support substrate includes an oxide layer overlying a silicon substrate, which is characterized by (100) crystalline orientation, p-type conductivity, and light doping. In a specific embodiment, the p-type heavily doped (110) silicon layer is formed as follows. A p-type heavily doped (110) silicon layer is formed overlying a first silicon substrate which is a lightly doped p-type (110) substrate. A first oxide layer is formed overlying the p-type heavily doped (110) silicon layer. Hydrogen ions are implanted into the heavily doped (110) silicon layer to form a region therein sufficiently weakened by the hydrogen to allow cleaving the heavily doped (110) silicon layer along the region to form an upper (110) layer and a lower (110) layer. In an embodiment, a second oxide layer is formed overlying the first support silicon substrate. The method includes bonding the first substrate to the first support silicon substrate and cleaving the p-type heavily doped (110) silicon layer along the region leaving the lower layer bonded to the second silicon dioxide layer overlying the first support silicon substrate. The lower (110) layer is characterized by p-type conductivity and heavy doping. In a specific embodiment, the first support substrate is removed by grinding the silicon substrate, etching the remaining silicon substrate using the oxide layer as an etch stop, and etching the oxide layer using the p-type heavily doped (110) silicon layer as an etch stop.

In another embodiment, the first support substrate includes a silicon substrate characterized by (110) crystalline orientation, p-type conductivity, and light doping, and the p-type heavily doped (110) silicon layer is formed using an epitaxial process or an ion implantation process. In a specific embodiment, the first support substrate is removed by grinding the silicon substrate and etching the remaining silicon substrate using the heavily doped p-type silicon as a etch stop. For example, the first support silicon substrate can be removed using a wet etching process including KOH or EDP.

The heavily doped (110) p-type silicon layer provides a low resistance device region. In a specific embodiment, the heavily doped (110) p-type silicon layer is characterized by a doping concentration of about $6 \times 10^{19}$ cm−3 higher. In another embodiment, the heavily doped (110) p-type silicon layer is characterized by a doping concentration of about $1 \times 10^{17}$ cm$^{-3}$ higher. The resistance can be further reduced by using a thin layer of the p-type heavily doped (110) silicon layer. For example, this layer can have a thickness between approximately 0.5 um to approximately 3 um. On the other hand, the bottom metal layer has sufficient thickness for supporting the semiconductor device. In a specific example, the bottom conductor layer has a thickness of about 50 um.

In an embodiment the high dielectric constant material has a dielectric constant higher than that of a silicon dioxide. Merely as examples, the high dielectric constant material has a thickness of about 5 nm to about 50 nm. The high dielectric constant material, such as $HfO_2$, can be formed using an atomic layer deposition (ALD) process. In one embodiment, the gate dielectric layer includes a thin interfacial dielectric layer underlying the high dielectric constant material. The thin interfacial layer can include oxynitride, chemical oxide, or thermal oxide.

In accordance with another embodiment of the invention, a semiconductor device includes a bottom conductive layer and a first p-type semiconductor layer overlying the bottom conductor layer. The first p-type semiconductor layer is heavily doped and is characterized by a surface crystal orientation of (110) and a first conductivity. The semiconductor device includes a second p-type semiconductor layer having overlying the first p-type semiconductor layer. The second semiconductor layer is also p-type and is characterized by a lower conductivity than the first conductivity. Moreover, the semiconductor device has a gate dielectric layer including a high dielectric constant material. The gate dielectric layer is formed on a (110) crystalline plane in the second p-type semiconductor layer. A top metal layer overlies the second p-type semiconductor layer and forms a top contact to the device. In this semiconductor device, a current conduction from the top metal layer to the bottom metal layer and through the second p-type semiconductor layer is characterized by a hole mobility along a <110> crystalline orientation and on (110) crystalline plane.

In a specific embodiment of the semiconductor device, the first p-type semiconductor layer is characterized by a doping concentration of 1E17/cm$^3$ or higher. In another embodiment, the first p-type semiconductor layer is characterized by a doping concentration higher than 6E19/cm$^3$.

In a specific embodiment, the semiconductor device includes a trench gate MOSFET having a trench extends into the second p-type semiconductor region. A gate dielectric layer lines sidewalls and bottom of the trench. The trench gate MOSFET includes a gate electrode over the gate dielectric in the trench and p-type source regions flanking each side of the gate electrode in the trench. The MOSFET also includes a p-type drift region, an n-type body region extending over the drift region, and p-type source regions in the body region adjacent to the trench.

In another embodiment, the semiconductor device includes a shielded gate trench MOSFET having a trench extending into the second semiconductor layer. A shield dielectric lines sidewalls and a bottom surface of the trench. The shielded gate trench MOSFET includes a shield electrode in a lower portion of the trench and is insulated from the second semiconductor layer by the shield dielectric. An inter-electrode dielectric overlies the shield electrode, and a gate dielectric lines upper portions of trench sidewalls. The shielded gate trench MOSFET also includes a gate electrode in an upper portion of the trench over the inter-electrode dielectric. The gate electrode is insulated from the second semiconductor layer by the gate dielectric. In one embodiment, the second semiconductor layer includes a p-type drift region, an n-type body region extending over the drift region, and p-type source regions in the body region adjacent to the trench.

The following detailed description and the accompanying drawings provide a better understanding of the nature and advantage of the present invention.

DETAILED DESCRIPTION OF THE INVENTION

Figure 1A:
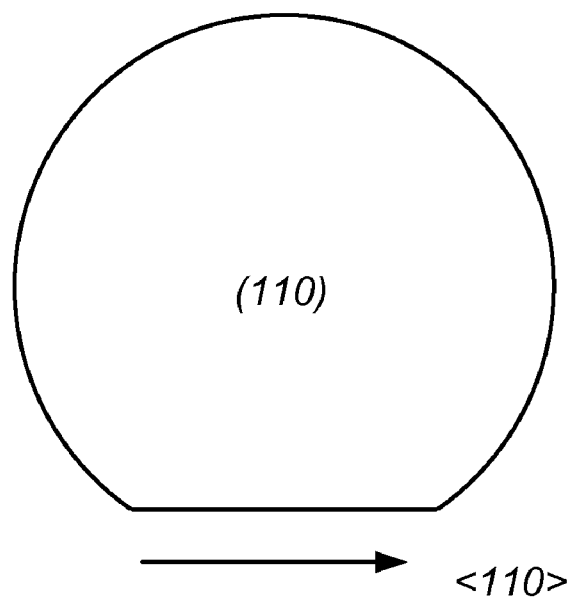
FIGS. 1A and 1B are simplified view diagrams illustrating crystalline orientations in a (110) wafer in accordance with embodiments of the invention.

Embodiments of the present invention provide various techniques for forming semiconductor devices using p-type (110) oriented silicon material and high dielectric constant gate dielectrics that provide increased current conduction, improved gate dielectric quality, and reduced substrate resistance. Depending upon the embodiment, the present invention includes various features, which may be used. These features include the following. In embodiments of the present invention, high mobility p-channel devices are realized on the (110)/<110> crystallographicaly configured silicon wafer to achieve high hole mobility in the channel region. The symbol (110)/<110> is used herein to denote current conduction along a <110> crystalline orientation and on a (110) crystalline plane. In some embodiments, the contribution of the (110) silicon substrate to device on-resistance is reduced by using a thin heavily doped (110) substrate. Embodiments of the present invention also provide (110) oriented silicon silicon-on-metal (SOM) structures that allow substantially improved $R_{DSon}$ without increasing gate charge at the vertical power trench devices. Moreover, embodiments of the invention also provide a gate dielectric having high dielectric constant dielectric material formed by a deposition method for improving the quality of gate dielectric on the (110) silicon surface.

The above features may be in one or more of the embodiments to follow. These features are merely examples, which should not unduly limit the scope of the claims herein. One of ordinary skill in the art would recognize many variations, modifications, and alternatives.

A focus for power MOSFET device technology development includes reducing both on-resistance ($R_{DSon}$) and gate charge, especially gate-to-drain charge ($Q_{gd}$). For example, in trench MOSFET, $R_{DSon}$ can be reduced with increasing trench density by reducing device pitch. This approach, however, often leads to higher $Q_{gd}$. It also can increase difficulty in contact formation for both the heavy body region and source region. This pitch miniaturization also can lead to higher leakage failure rate due to the defect generated by heavy body process. Therefore, other methods for reducing channel resistance are desirable.

According to one embodiment of the invention, a method is provided to fabricate p-channel trench MOSFET device on (110)-oriented silicon wafers with flat (notch) in crystallographic <110> direction to reduce the channel resistance. It is known that the hole mobility in the inversion layer can be more than doubled on silicon (110) plane in <110> direction ((110)/<110>) than on (100) plane in <100> direction ((100)/<100>). A relationship between hole mobility and channel resistance can be expressed in the following equation.

$$R_{ch} = \frac{L}{Z\mu_p C_{ox}(V_G - V_T)}$$

where L is the channel length, Z is the channel width, $C_{ox}$ is the gate oxide capacitance per unit area, $V_G$ is the gate voltage, $\mu_p$ is the hole mobility in channel region, and $V_T$ is the threshold voltage. The p-channel devices built on (110)/<110> crystallographically configured wafers thus have much reduced the $R_{ch}$ due to improved $\mu_p$.

Figure 1B:
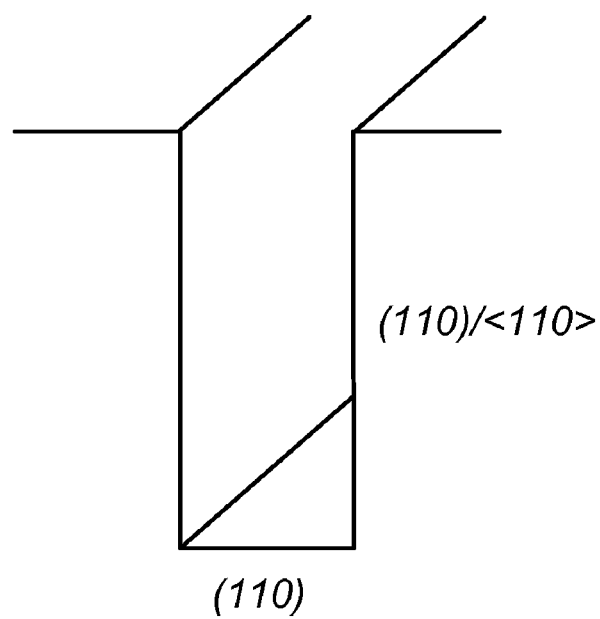

As shown in FIG. 1A, the (110)/<110> configuration can be realized by using (110)-oriented silicon wafers with flat (notch) parallel to the <110> crystallographic direction. As shown in FIG. 1B, the vertical trenches on this type of wafers have both trench bottom and side wall on (110) planes and the direction of current flow from the trench top to the trench bottom (channel direction) is in the <110> direction. In order to benefit from the higher hole mobility, however, certain challenges in device processing need to be overcome.

A challenge in applying the (110)/<110> wafers for power MOSFET devices is a lack of readily available heavily doped (110) oriented wafers resulted from difficulties associated with growing heavily boron doped (110) oriented Czochralski (CZ) silicon wafers. Due to very small boron segregation coefficient on (110) oriented silicon crystal, boron incorporation is very limited. The resistivity of such ingot is in the range of tens Ω-cm. To build the vertical power trench device, it is necessary to have a heavily boron doped (110) oriented substrate and a technology to reduce the substrate contribution to the device on-resistance. An example of heavily boron doped (110) oriented substrate has a resistivity on the order of 100 mΩ-cm or lower, whereas substrates having resistivity in the range of about tens Ω-cm and higher are considered to be lightly doped in embodiments of the present invention. In an embodiment, heavily boron doped (110) oriented substrate may have a doping concentration of $1 \times 10^{17}$ cm$^{-3}$ or higher. Embodiments the present invention provides methods for forming heavily doped (110)-oriented silicon layer for device application. In a specific embodiment, the invention also provides methods for further reducing drain resistance with a thin heavily doped (110)-oriented silicon layer on a metal substrate.

A process flow for forming a heavily doped p-type (110) layer according to an exemplary embodiment of the invention can be briefly summarized below. A heavily doped thin (110) silicon epi layer with a low resistivity is grown on the lightly doped (110) orientation silicon seed wafer (seed wafer). Alternatively, this heavily doped thin (110) silicon layer can be formed by ion implantation or diffusion on the lightly doped (110) silicon seed wafer. Then a thermal silicon dioxide layer is grown on the top of the thin heavily doped layer. Next, hydrogen ions/molecules are implanted through the silicon dioxide layer and into the heavily doped (110) seed wafer. The seed wafer is then bonded to a support substrate which is topped with a thermal silicon dioxide layer. The bonded wafer pair is then subjected to the two-step low temperature annealing procedure for the separation of the heavily boron doped (110)-layer of the seed wafer along a cleaving plane defined by the hydrogen implantation energy. The thickness of the transferred heavily doped p-type (110) layer can range from 0.5 to 1.5 μm in a specific embodiment. Various device structures can then be formed using this heavily doped p-type (110) silicon layer. A more detailed description for this method is provided below in connection with FIGS. 4A-4F.

In an alternative embodiment, a heavily doped thin (110) silicon layer can be formed on a the lightly doped (110) silicon seed wafer using an epitaxial process or an ion implantation process. Various devices structures can be formed using the heavily doped thin (110) layer as a starting material. Subsequently, the lightly doped substrate can be removed using a selective etching process. A more detailed description for this method is provided below in connection with FIGS. 7A-7G.

Another challenge in applying the (110)/<110> configured wafers for power trench MOSFET devices is the difficulty in forming high quality gate oxide on (110) plane. An issue is to reduce both fixed oxide charge and interface trap density ($D_{it}$) to achieve acceptable threshold voltage and threshold voltage stability. It has been established that the $D_{it}$ is proportional to the density of available bonds on the surface. Table 1 summarizes the silicon properties of different crystallographic planes. The $D_{it}$s at (100) and at (111) planes are $2\times10^{10}$ and $2\times10^{11}$/cm$^2$-eV, respectively. The fact that available bonds per unit area on the (110) plane are between (100) and (111) planes indicates that the $D_{it}$ of (110) plane will be between $2\times10^{10}$ and $2\times10^{11}$ 1/cm$^2$-eV although no data is available. According to embodiments of the invention, reducing oxide growth rate and adding additional hydrogen annealing can further reduce the $D_{it}$ and fixed oxide charge and improve gate oxide integrity.

TABLE 1

Physical properties of Silicon

| Orientation | Surface Density 1/cm$^2$ | Available Bonds 1/cm$^2$ | $D_{it}$ at mid-gap 1/cm$^2$-eV |
| --- | --- | --- | --- |
| (100) | $6.8 \times 10^{14}$ | $6.8 \times 10^{14}$ | $2 \times 10^{10}$ |
| (110) | $9.6 \times 10^{14}$ | $9.6 \times 10^{14}$ | |
| (111) | $7.85 \times 10^{14}$ | $11.8 \times 10^{14}$ | $2 \times 10^{11}$ |

With the continued miniaturization of integrated circuit, gate dielectrics have been scaled to ever smaller thicknesses. Because SiO$_2$ has a relatively low dielectric constant of about 3.9, such scaling is leading to SiO$_2$ layers so thin, in the range approaching ~1.0 nm, that excessive leakage current can comprise device performance. As a result, higher dielectric constant (~15-25) gate dielectrics have been proposed as alternatives. According to embodiments of the present invention, a dielectric including a high dielectric constant (high k) material overlying a thin underlayer is suitable as a gate dielectric over a (110) silicon surface. In a specific embodiment, a method is provided for a gate dielectric including a high k dielectric material formed by atomic layer deposition (ALD) over a thin underlayer. Such a gate dielectric can be used advantageously to overcome the difficulties encountered by thermal SiO$_2$ gate dielectrics over a (110) silicon surface. Depending upon the embodiment, the high k dielectric material can include HfO$_2$, ZrO$_2$, Gd$_2$O$_3$, La$_2$O$_3$, CeO$_2$, TiO$_2$, Y$_2$O$_3$, Ta$_2$O$_5$ and Al$_2$O$_3$, or other films.

Depending on the embodiments, the underlayer can be a thin thermal SiO$_2$, chemical oxide which is often formed in a chemical wafer cleaning process, or an oxynitride layer. In an embodiment, the thickness of the underlayer can be in the range of approximately 5-10 Å. Of course, there can be other variations and alternatives.

In an embodiment, an atomic layer deposition (ALD) process is used to form a conformal dielectric film relatively independent of the surface orientation of the underlying substrate. Further, atomic layer deposition can allow the control and selection of the dielectric constant. In ALD, gaseous precursors are introduced in the form of pulses to the substrate surface within a reaction chamber, which usually is under low pressure. Between the pulses, the reaction chamber is purged with an inert gas, and/or evacuated. In each reaction step, the precursor saturates at the substrate surface and is chemisorbed. Subsequent pulsing with a purging gas removes excess precursor from the reaction chamber. A further pulsing phase introduces a second precursor to the substrate where the growth reaction of the desired film takes place. After the growth reaction, excess precursor and reaction byproducts are purged from the reaction chamber.

In a specific embodiment, a high dielectric constant material such as an HfO$_2$ film is grown using H$_2$/HfCl$_4$ chemistry in an ALD process. First, an underlayer is formed on a substrate. The underlayer is a thin interfacial dielectric layer underlying the high dielectric constant material. For example, the interfacial layer can be a thin oxynitride layer, a thin thermal oxide layer, or a chemical oxide layer. As an example, the chemical oxide can be formed in a wet chemical wafer cleaning process. In an embodiment, this interfacial layer serves to pacify the surface of the substrate.

After the underlayer preparation, the wafers are loaded into the ALD process chamber, where the HfO$_2$ film is grown at 300° C. One cycle HfO$_2$ growth can include a pulse of H$_2$O, followed by a pulse of HfCl$_4$, each carried by a flow of N$_2$ and separated by several seconds. The total pressure during growth can be maintained at, for example, 1-10 Torr. The deposition temperature can be in the range of about 180-600° C. The thickness of the HfO$_2$ film can be controlled by the number and duration of pulses of precursors. For example, the thickness can be from about 50 Å to about 500 Å, depending on the embodiments.

The process of forming heavily doped p-type (110) thin substrate and high dielectric constant gate dielectric formation according to the present invention can be applied to the process flow of a variety of different power MOSFET processes. In an embodiment, this process can be used in the manufacture of a trench MOSFET. Alternatively, the trench formation process can be used in forming other trench FET structure such as a shielded gate FET. Examples of a trench gate MOSFET and a shielded agate MOSFET are provided below.

Figure 2:
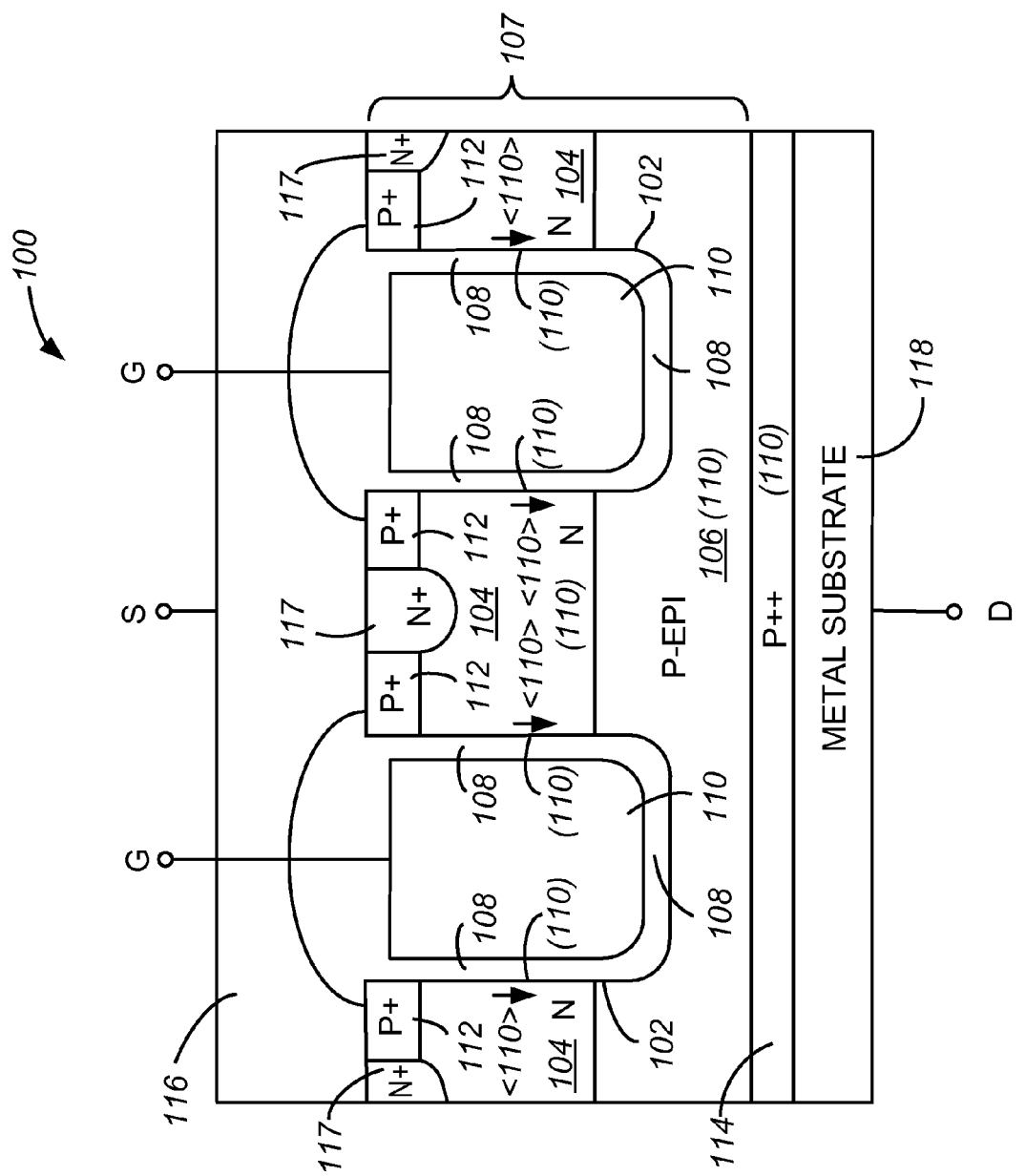
FIG. 2 is a simplified cross-sectional view diagram illustrating a p-type trench gate MOSFET in accordance with an embodiment of the invention.

FIG. 2 is a simplified cross-sectional view diagram illustrating a p-type trench gate MOSFET 100 having a current conduction along a <110> crystalline orientation and on (110) crystalline plane ((110)/<110>) in accordance with an embodiment of the invention. It is to be understood, however, that the principle techniques of the present invention apply to both discrete devices as well as integrated circuits using any processing technology. As with all other figures described herein, it is to be understood that the relative dimensions and sizes of various elements and components depicted in the figures do not exactly reflect actual dimensions and are for illustrative purposes only.

As shown in FIG. 2, MOSFET 100 includes gate terminals G coupled to gate electrodes 110 that are formed inside trenches 102. Trenches 102 extend from the top surface of an N– well body region 104 terminating in a p-type drift or epitaxial region 106. In one embodiment, trenches 102 are lined with thin dielectric layers 108 and also includes conductive material 110, such as doped polysilicon. P-type source regions 112 are formed inside the N– well body region 104 adjacent trenches 102. MOSFET 100 includes N+heavy body regions 117 formed inside the N– well body region 104. MOSFET 100 also has a metal source layer 116. A drain terminal D for MOSFET 100 is coupled to a metal substrate 118 disposed on a back surface of p-type heavily doped silicon layer 114. The epitaxial layer 106 and body region 104 form a semiconductor structure layer 107 disposed on the heavily doped p-type silicon layer 114.

As noted in FIG. 2, p-type heavily doped silicon layer 114, p-type drift or epitaxial region 106, and n-well body region 104 all have (110) crystalline orientation. Moreover, the trench sidewalls between p-type source regions 112 and p-type drift region 106 also have the (110) crystalline orientation. As result, channel regions formed on the trench sidewall allow current conduction from the top metal layer 116 to the bottom metal layer 118 along a <110> crystalline orientation and on (110) crystalline plane. As described above, this hole conduction is characterized by a higher hole mobility. As a result, device performance of p-type trench gate MOSFET 100 is improved by the enhanced hole mobility along a <110> crystalline orientation on (110) crystalline plane.

Additionally, gate dielectric layer 108 in FIG. 2 includes a high-k dielectric layer overlying a thin interfacial dielectric layer which overlies the trench sidewall. According to an embodiment of the present invention, the thin interfacial dielectric layer can be formed by chemical oxide, thermal oxide, or oxynitride having a thickness of about, e.g., 5-10 Å. In an embodiment, the high-k dielectric layer is formed by an atomic layer deposition (ALD) process at a deposition temperature of about 180°-600° C. Depending on the embodiment, the high-k dielectric layer an have a thickness of, e.g., 50°-500°.

Thus, this embodiment of the present invention shows that p-type trench gate MOSFET 100 provides enhanced hole mobility and improved gate oxide quality on the (110) crystalline plane compared to conventional p-type trench MOSFETs.

Figure 3:
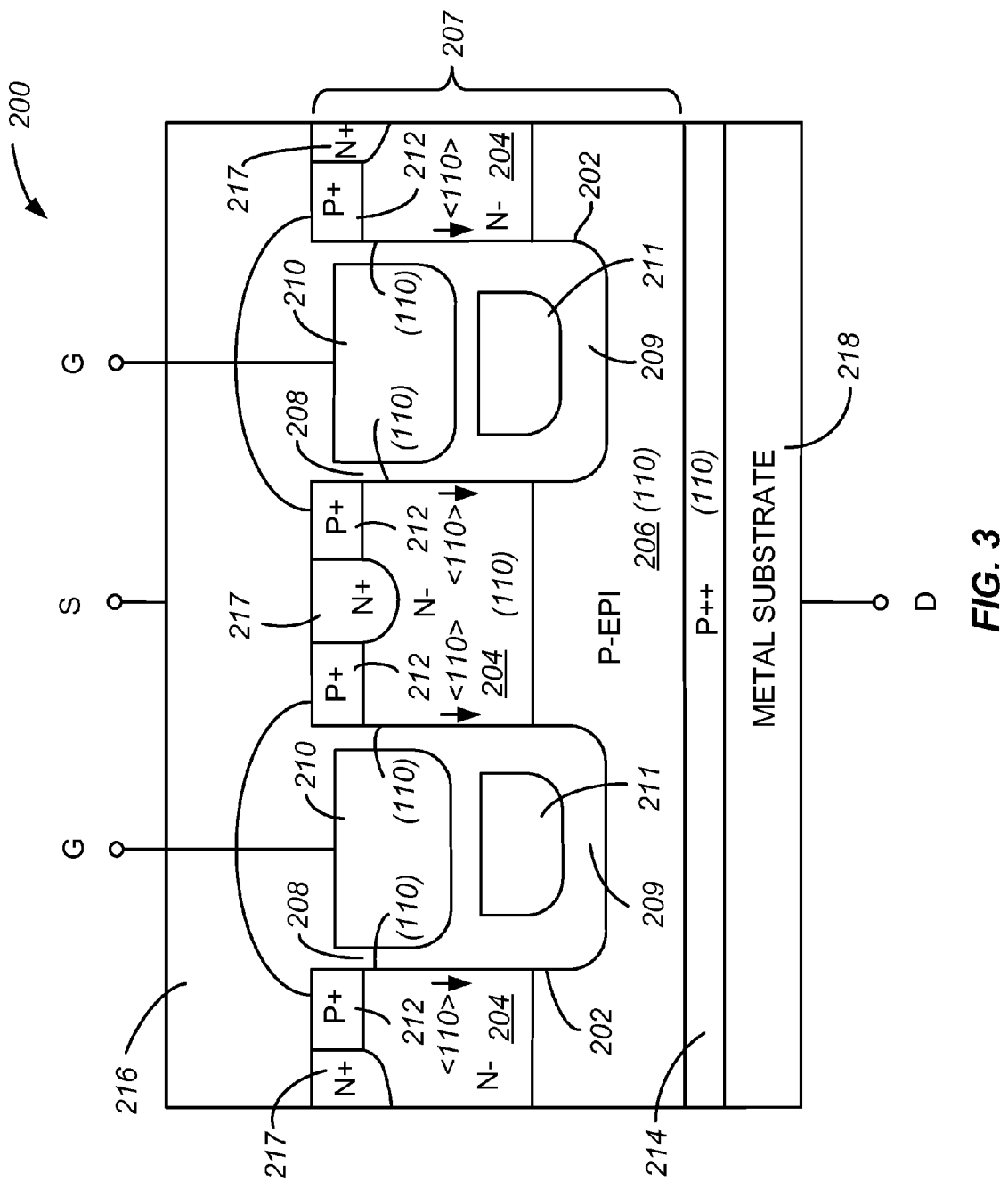
FIG. 3 is a simplified cross-sectional view diagram illustrating a p-type shielded gate trench MOSFET in accordance with another embodiment of the invention.

FIG. 3 is a simplified cross-sectional view diagram illustrating a p-type shielded gate trench MOSFET 200 having improved (110)/<110> hole mobility in accordance with an embodiment of the invention. As shown, MOSFET 200 includes gate terminals G coupled to gate electrodes 210 that are formed inside trenches 202. Trenches 202 extend from the top surface of an N– well body region 204 terminating in a p-type drift or epitaxial region 206. In one embodiment, the upper portions of trenches 202 are lined with thin gate dielectric layers 208 and includes conductive material 210, such as doped polysilicon, which form the gate electrodes. Shielded gate electrodes 211, made of conductive material such as doped polysilicon, are insulated from lower portions of the trenches 202 with shield dielectric layers 209. P-type source regions 212 are formed inside the N-well body region 204 adjacent trenches 202. MOSFET 200 also includes a N+ heavy body regions 217 formed inside the N-well body region 204. MOSFET 200 further includes a metal source layer 216. A drain terminal D for MOSFET 200 is coupled to a metal substrate 218 disposed on a back surface of p-type heavily doped silicon layer 214. The epitaxial layer 206 and body region 204 form a semiconductor structure layer 207 disposed on the heavily doped p-type silicon layer 214.

Similar to device 100 of FIG. 2, in p-type shielded gate trench MOSFET 200 in FIG. 3 includes p-type heavily doped silicon layer 214, p-type drift or epitaxial region 206, and N-well body region 204 all having the (110) crystalline orientation. Moreover, the trench sidewalls also have the (110) crystalline orientation and channel regions formed on the trench sidewall that allow current conduction from the top metal layer to the bottom metal layer and through the second p-type semiconductor layer. This current conduction is characterized by a hole mobility along a <110> crystalline orientation and on (110) crystalline plane. Additionally, gate dielectric layers 208 in FIG. 3 includes a high-k dielectric layer overlying a thin interfacial dielectric layer, similar to gate dielectric layers 108 in FIG. 1. Thus, p-type shielded gate MOSFET 200 provides enhanced hole mobility and improved gate oxide quality on (110) a crystalline plane compared to conventional p-type shielded gate MOSFETs.

Figure 4A:
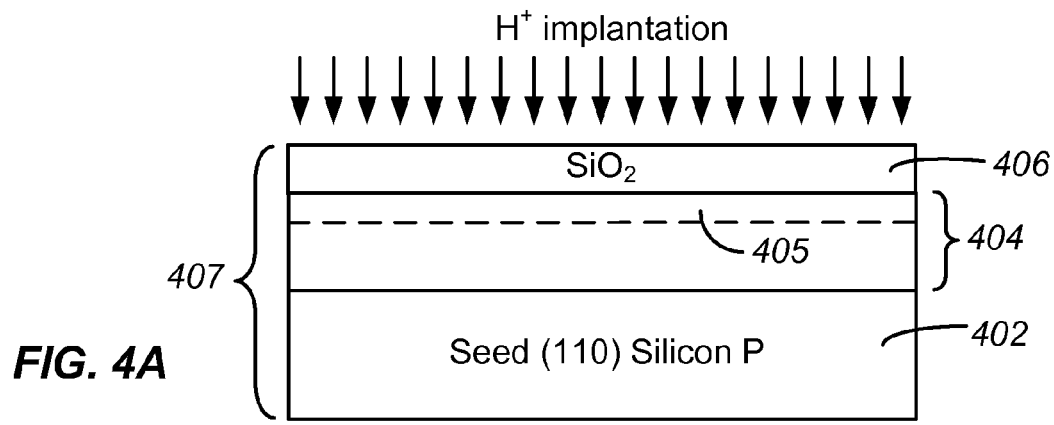
FIGS. 4A-4F are simplified cross-sectional view diagrams illustrating a simplified process flow for forming a heavily doped p-type (110) oriented substrate structure according to an embodiment of the present invention.

FIGS. 4A-4F are simplified cross-sectional view diagrams illustrating a process flow for forming a heavily doped p-type (110) substrate structure according to an embodiment of the present invention. FIG. 4A illustrates a cross-sectional view of a seed (110) silicon material 402, which may be doped by dopants such as Boron. In an embodiment, silicon material 402 may be a lightly doped p-type (110) silicon substrate. A heavily doped p-type epi layer 404 with a resistivity less than 100 mΩ-cm (dopant concentration $>1\times10^{17}$ cm$^{-3}$) and a thickness less than 3.0 μm is grown on the lightly doped (110) orientation silicon substrate. Alternatively, heavily doped layer 404 may be formed by implanting dopants in silicon material 402. Then a thermal silicon oxide layer 406 with a thickness of 400~500 Å is grown on the top of heavily doped layer 404. Hydrogen ions/molecules are implanted through the silicon dioxide layer at a dose of $3\times10^{16}$ cm$^{-2}$ and energy of 60-170 KeV. In one embodiment, the wafer including layers 402, 404, and 406 is referred to as the seed wafer 407 hereafter. In an embodiment, the hydrogen implant creates a hydrogen rich region 405 delineated as the dotted line in the epi layer 404.

In one embodiment, the concentration of hydrogen ions is provided at a sufficient depth and energy potential to form a hydrogen rich region, or cleavable region, 405, having an exemplary thickness of between about 1-2 μm. Because of hydrogen embrittlement, the cleavable region 405 lattice is weaker than non-hydrogen doped silicon lattice.

Figure 4B:
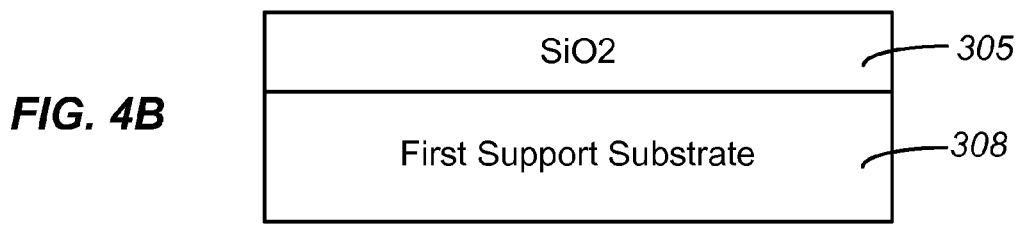

FIG. 4B illustrates a cross-sectional view of one embodiment of a first support substrate 308 accordance with embodiments of the invention. In one embodiment, the first support substrate 308 is a (100) silicon substrate. In another embodiment, the (100) silicon substrate is covered by a silicon dioxide (SiO$_2$) layer 305. The SiO$_2$ layer 305 is used as an etch stop layer and may be virtually any thickness that may be used to advantage. For example, in one embodiment, the SiO$_2$ layer 305 may be about between 1000 and 2500 Å. In another embodiment, the SiO$_2$ layer 305 may be about between 2500 and 4000 Å. The SiO$_2$ layer 305 may be grown or deposited on the support substrate 308 using virtually any SiO$_2$ layer formation process. For example, the SiO$_2$ layer 305 may be grown using a thermal oxidation process.

Figure 4C:
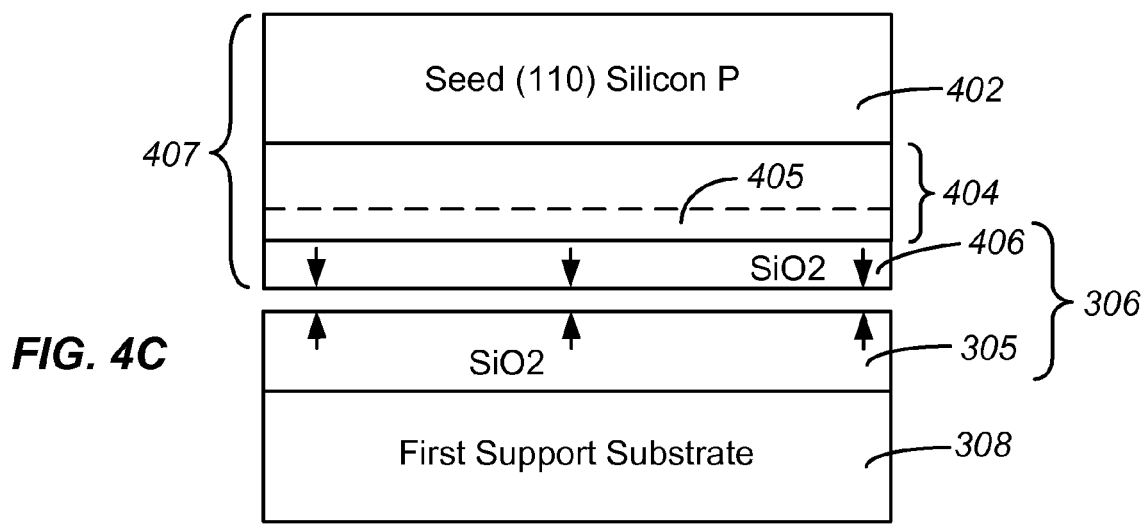

In FIG. 4C the first support substrate 308 and oxide layer 305 is bonded to seed wafer 407 including layers 402, 404, and 406 as shown in FIG. 4A. In a specific embodiment, oxide layers 305 and 406 are bonded together in the bonding process to form oxide layer 306. The bonding can be carried out using any of a number of bonding techniques. For example, after a wet chemical and de-ionized (DI) water treatment to render the SiO$_2$ layers 305 and 406 with a hydrophilic surface, the SiO$_2$ layer 305 and the seed wafer 407 may be bonded at room temperature using conventional bonding techniques.

Figure 4D:
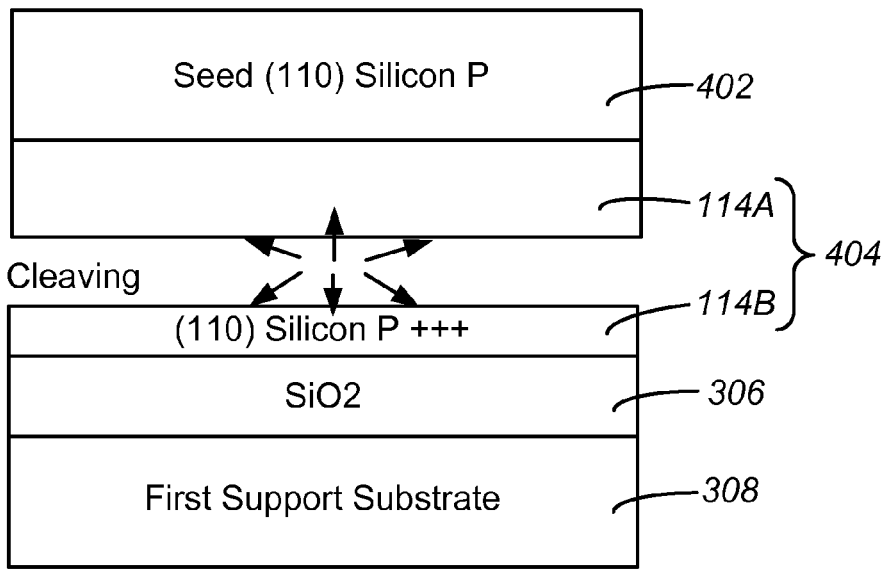

In FIG. 4D a cleaving process is performed to divide the epi layer 404 into two separate layers 114A and 114B. The cleaving process leaves a lower layer 114B of heavily doped (110) p-type silicon on the first support substrate 308 and a remaining layer portion 114A of the epi layer on the seed silicon material 402. The cleaving may be carried out using any number of cleaving processes to break the lattice structure of the cleavable region 405. In one embodiment, the cleaving process includes annealing the seed wafer 407 and the initial substrate 308 at a temperature of between 150 and 300° C. for about 5 hours to 10 hours. In another embodiment the cleaving process includes annealing the seed wafer 407 and the first support substrate 308 at a temperature of about 450° C. for about 15 minutes. In a specific embodiment, the bonded wafer pair is subjected to a two-step low temperature annealing procedure. The first anneal at 150-300° C. for 10-20 hours is used for the fusion bond pre-strengthening, and the second anneal at 450° C. for 45 minutes serves for the separation of the heavily boron doped (110)-layer of the seed wafer along the cleaving plane defined by the hydrogen implantation energy. The thickness of the transferred heavily boron doped (110)-layer is defined therefore by energy of the hydrogen implant and range from 0.5 to 1.5 μm in a specific embodiment.

Figure 4E:
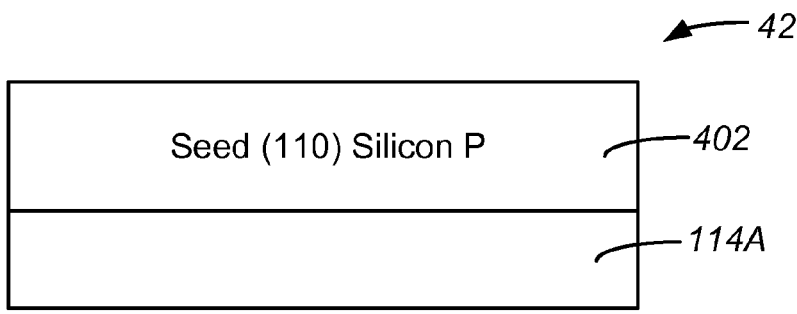
Figure 4F:
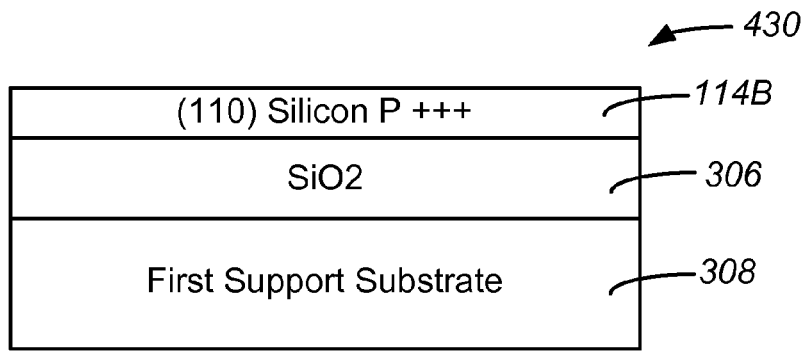

FIGS. 4E and 4F are simplified cross-sectional view diagrams illustrating the two parts formed in the cleaving process described in FIG. 4D. In FIG. 4E a composite material 420 is formed which includes lightly doped p-type (110) silicon wafer 402 and a heavily p-type doped (110) epi layer 114A. In one embodiment, composite material 420 can be used to form another seed wafer, such as seed wafer 407 in FIG. 4A, and used repeatedly in a process as described in FIGS. 4A-4D. FIG. 4F shows a composite material 430, which includes heavily doped p-type (110) layer 114B overlying an oxide layer now labeled 306 which overlies the first support substrate 308. In one embodiment layer 114B has a resistivity of 8 mΩ-cm, which is much lower than that of commercially available (110) silicon wafers. In one embodiment this layer is used in forming a vertical device and provides a good ohm contact for backside meta layer. An example of a method for forming a vertical device is discussed below.

Figure 5A:
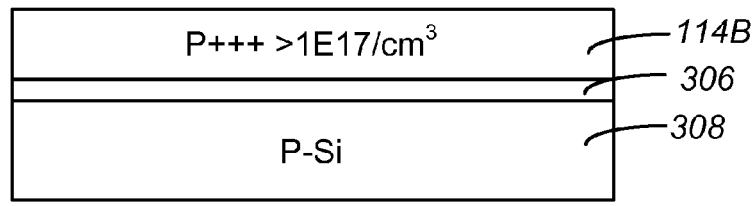
FIGS. 5A-5H are simplified cross-sectional view diagrams illustrating a process flow for forming a semiconductor device using a heavily doped p-type (110) oriented substrate according to an embodiment of the present invention.

FIGS. 5A-5H are simplified cross-sectional view diagrams illustrating a process flow for forming a semiconductor device using a heavily doped p-type (110) oriented substrate according to an embodiment of the present invention. FIG. 5A illustrates a cross-sectional view of heavily doped p-type (110) silicon layer 114B over an oxide layer 306 which in turn overlies support layer 308. This structure is similar to the semiconductor process structure 430 of FIG. 4F. In one example, support layer 308 may be a lightly doped (100) silicon layer. In a specific embodiment, layer 114B has a doping concentration of $1E17/cm^3$ or higher. In one embodiment, the structure in FIG. 5A may be formed using a process described in FIGS. 4A-4F. Alternatively, the structure in FIG. 5A may be formed using another method.

Figure 5B:
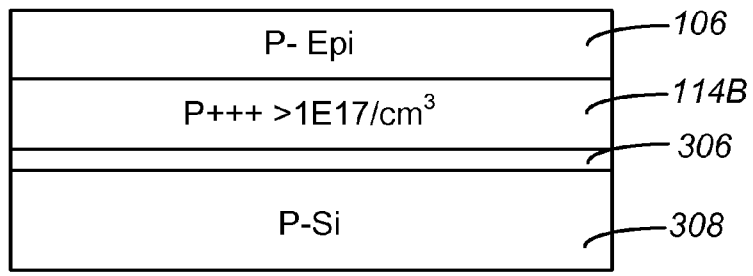

In FIG. 5B, a lightly doped p-type (110) epitaxial layer 106 is formed on the doped p-type (110) silicon layer 114B. Optionally, the cleaved doped silicon layer 114B may be pretreated in a CVD chamber to prepare the silicon layer 114B for the epitaxial layer 106 formation. The pretreatment may be used to generate a more uniform surface.

Figure 5C:
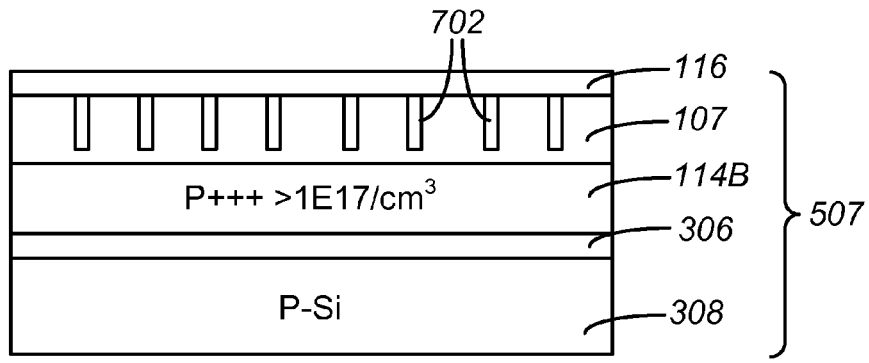

In FIG. 5C, semiconductor devices 702 are formed in and over epitaxial layer 106 and form semiconductor structure layer 107. The formation of the semiconductor structure layer 107 may be done by any conventional semiconductor structure formation techniques. For example, the semiconductor structures 702 may be formed on and/or within the epitaxial layer 106 using conventional semiconductor structure fabrication steps such as layering, patterning, and doping. The semiconductor structures 702 may also be formed on and/or formed integral to the doped silicon layer 114B. In one example, semiconductor structure layer 107 may include trench gate MOSFET structures as discussed above in connection with FIG. 2. In another example, semiconductor structure layer 107 in FIG. 5C may include shielded gate trench MOSFET structures as discussed above in connection with FIG. 3. A method for forming a trench gate MOSFET having the (110)/<110> orientation is described below in connection with FIGS. 8A-8J. A more detailed description of a method for forming a shielded gate MOSFET having (110)/<110> orientation is provided below in connection with FIGS. 9A-9E.

Referring back to FIG. 5C, in one embodiment of MOSFETs, for example, metal layer 116 is formed on the semiconductor structures 702. The metal layer 116 may be applied using virtually any process some of which are described herein. In another embodiment, after the formation of the device layer 107, the initial substrate 308, $SiO_2$ layer 306, doped silicon layer 114B, and semiconductor structure layer 107 together form another intermediate semiconductor processing structure 507.

Figure 5D:
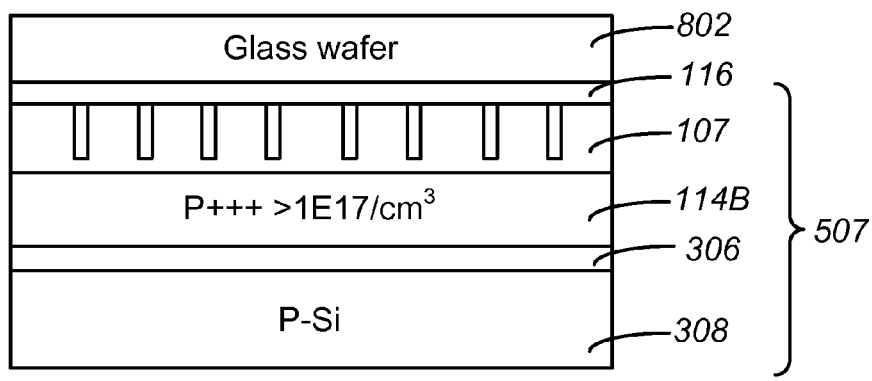

In FIG. 5D a second support substrate 802, for example, a glass wafer, is mounted to metal layer 116 over the semiconductor structure layer 107 to support the semiconductor process structure 507 for processing. For example, second support substrate 802 is mounted to the semiconductor process structures 507 using a UV releasable double sided tape, which provides an adhesive bond sufficient in strength to securely hold the intermediate semiconductor process structure for processing.

Figure 5E:
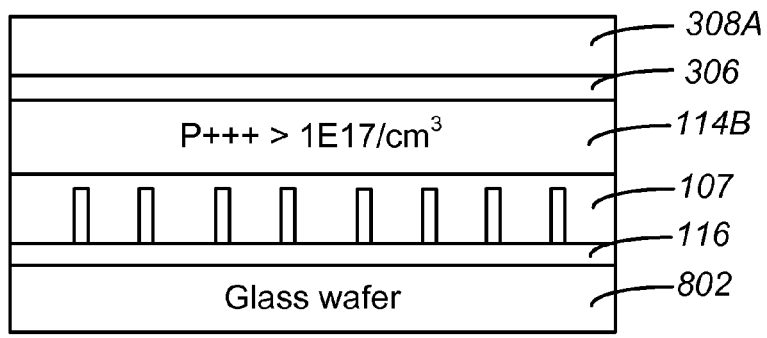

In FIG. 5E, the initial support layer 308, for example, a (100) silicon substrate, is thinned by a substrate thinning process. Optionally, in one embodiment, the initial substrate 308 is thinned using a mechanical thinning process such as mechanical polishing/grinding to form a thinner substrate 308A. The initial substrate 308 may be thinned, e.g., to about 8 mils to make it faster to remove with chemicals.

Figure 5F:
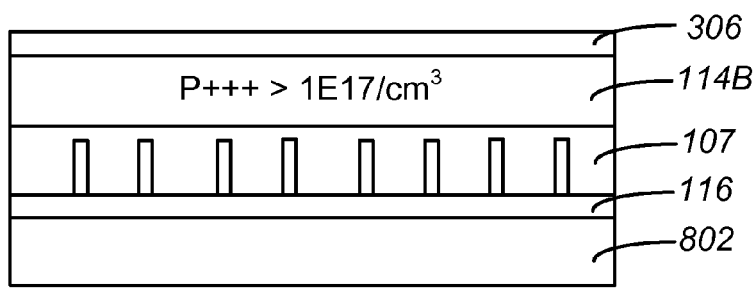

In FIG. 5F the remaining substrate 308A is removed using a substrate etching process. In one process, the substrate 308A is removed by chemically etching the substrate 308A with a chemical etching process using the buried $SiO_2$ layer 306 as an etch stop layer. As the $SiO_2$ layer 306 is configured to stop the chemical etching process, silicon layer 114B and the semiconductor structure layer 107 remain untouched by the chemical used to etch the initial substrate 308A. The chemical etching may be done by any process to remove the initial substrate 308A. For example, the etching process may be done with chemicals such as acid, hydroxides, and the like, that remove the initial substrate 308A, but do not etch the buried $SiO_2$ layer 306. In one process, the chemical etching process to remove the initial substrate 308A may be illustrated with the following chemical formula:

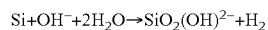

Where $SiO_2(OH)^{2-}$ is a soluble complex.

Figure 5G:
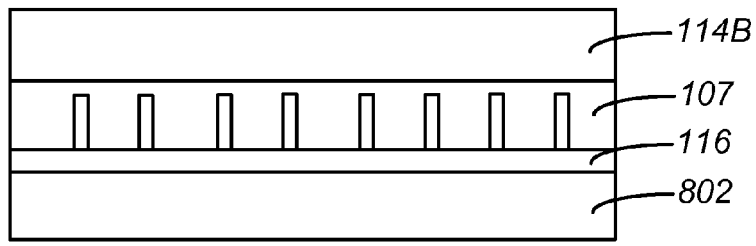

In FIG. 5G the $SiO_2$ layer 306 is removed by an etching process. The buried $SiO_2$ layer 306 may be chemically etched using a solution of HF. In this configuration, the heavily doped (110) silicon layer 114B is used as the etch stop. For example, the $SiO_2$ layer 306 may be etched with a 49 wt % HF solution at room temperature. This particular solution may etch the $SiO_2$ layer 306 at about 2.5 μm/min. The etching process for removing layer 306 can be illustrated with the following chemical equation:

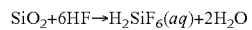

Figure 5H:
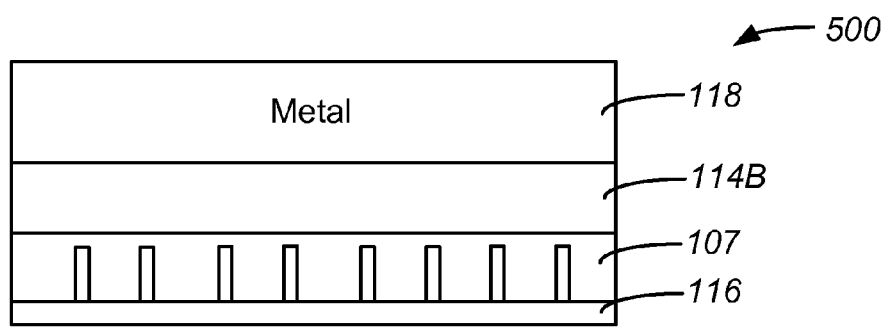

In FIG. 5H a metal substrate 118 is formed on the doped silicon layer 114B. In one embodiment, the metal substrate 118 may be formed using virtually any process, such as electroplating and/or using deposition processes such as plasma vapor deposition (PVD), chemical vapor deposition (CVD), and the like. In another example, the metal substrate 118 may be electroplated on the doped silicon layer 114B. The metal substrate 118 may include virtually any metal or conductor that may be used to advantage such as copper, aluminum, or alloys such as solder, and the like.

In FIG. 5H, support layer 802 is removed. The support layer 802 may be removed using any number of techniques. For example, the support layer 802 may be removed using an ultra violet light process where the bonding tape is configured to release when exposed to a sufficient amount of UV light for a predetermined duration. Subsequently, the semiconductor process structure 500 in FIG. 5H may be diced into individual devices (dies) in accordance with embodiments of the invention.

As discussed above in connection with FIGS. 4A-4F and FIGS. 5A-5H, the present invention provides a method for fabricating p-channel trench MOSFET device on (110)-oriented silicon material to facilitate hole current conduction in the <110> direction to reduce channel resistance. In a specific embodiment, the vertical trenches on this type of wafers have both trench bottom and side wall on (110) planes and the direction of current flow from the trench top to the trench bottom (channel direction) is in the <110> direction. The method can be used to form a vertical device, such as trench gate MOSFET or shielded gate trench MOSFET, in which a current conduction in the vertical direction is enhanced. For example, in FIG. 5H a current may be conducted between metal layers 116 and 118 and through device layer 107, where device layer 107 may include a trench gate MOSFET or a shielded gate trench MOSFET. In alternative embodiment, device layer 107 may also include other vertical devices such as diodes or IGBTs.

Figure 6:
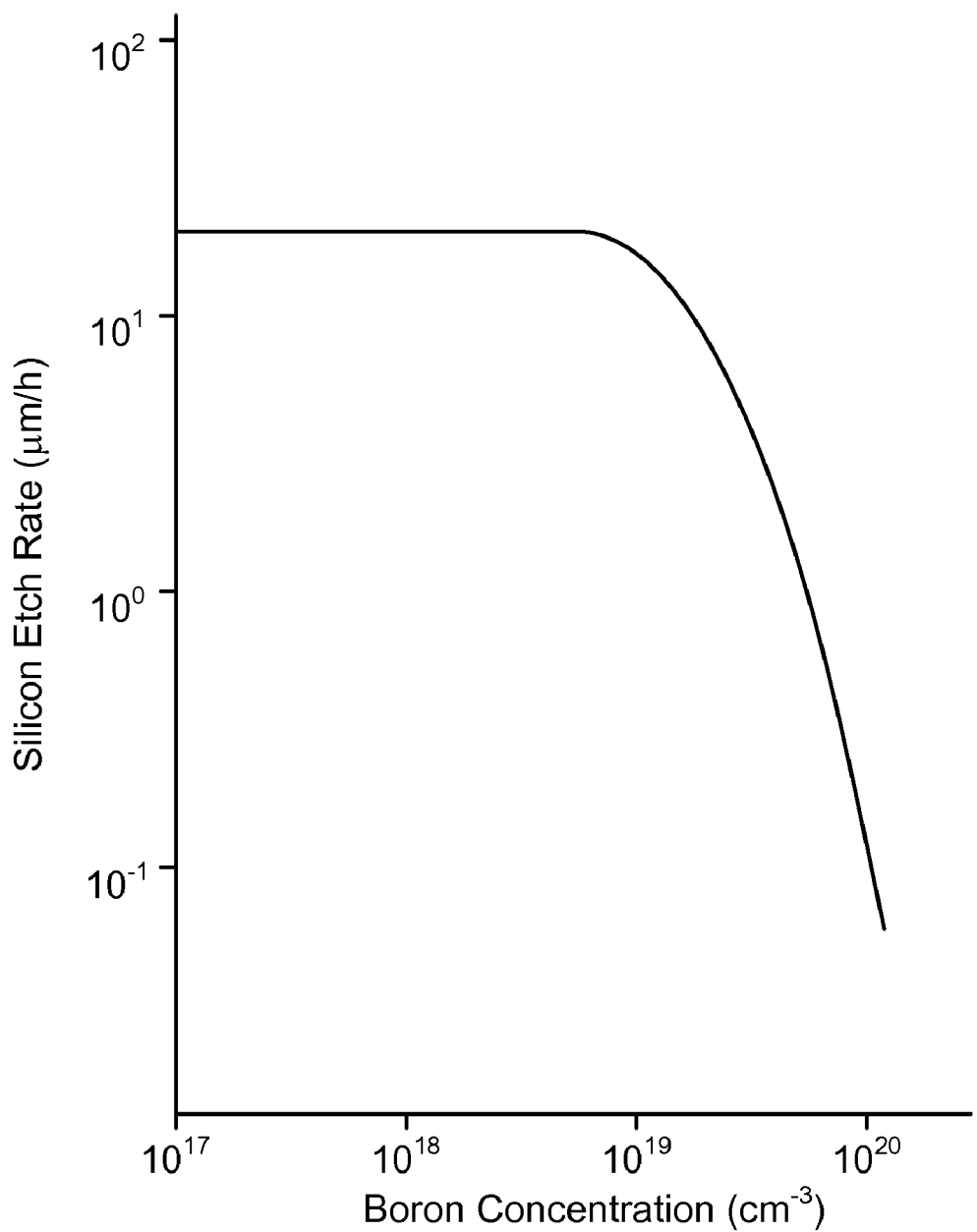
FIG. 6 is a simplified diagram illustrating variations in silicon etch rate as a function of boron concentration according to an embodiment of the present invention.

FIG. 6 is a simplified diagram illustrating a relationship between etch rate of a silicon substrate and its boron concentration according to an embodiment of the present invention. This diagram is merely an example, which should not unduly limit the scope of the claims herein. One of ordinary skill in the art would recognize other variations, modifications, and alternatives. As shown, the etch rate of silicon decreases sharply as its boron concentration is increased above about $1 \times 10^{19}$ cm$^{-3}$. Specifically there is significant etching rate difference between heavily and lightly boron doped silicon substrates with either KOH or ethylenediamine/pytocatechol/water (EDP). For example, in EDP solution at 81° C., the etching rate at boron concentration <$1 \times 10^{19}$ cm$^{-3}$ is about 20 µm/hr, compared to that of 0.1 µm/hr at the boron concentration of $1 \times 10^{20}$ cm$^{-3}$. The etching rate difference can be as large as 200 times. A similar etching rate difference has been observed in KOH chemistry as well. This etching difference will enable the heavily boron doped silicon layer as etching stop. This etch selectivity between lightly doped p-type silicon and heavily doped p-type silicon is used advantageously in a method in an embodiment of the present invention.

Figure 7A:
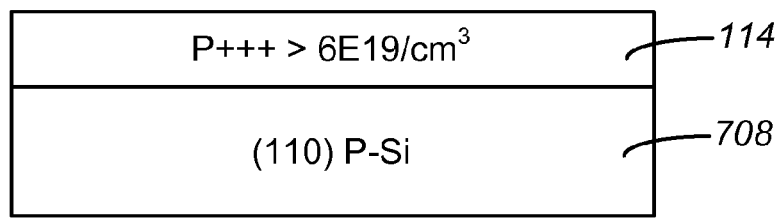
FIGS. 7A-7G are simplified cross-sectional view diagrams illustrating another process flow for forming a vertical device using a heavily doped p-type (110) oriented substrate according to an alternative embodiment of the present invention.
Figure 7B:
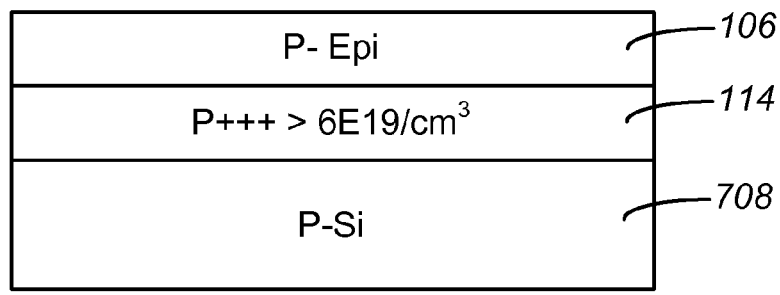
Figure 7C:
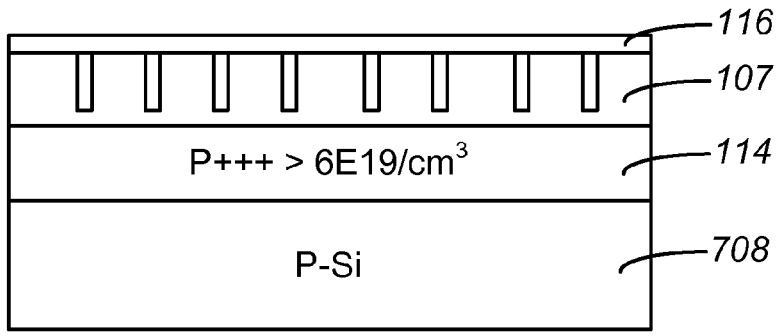
Figure 7D:
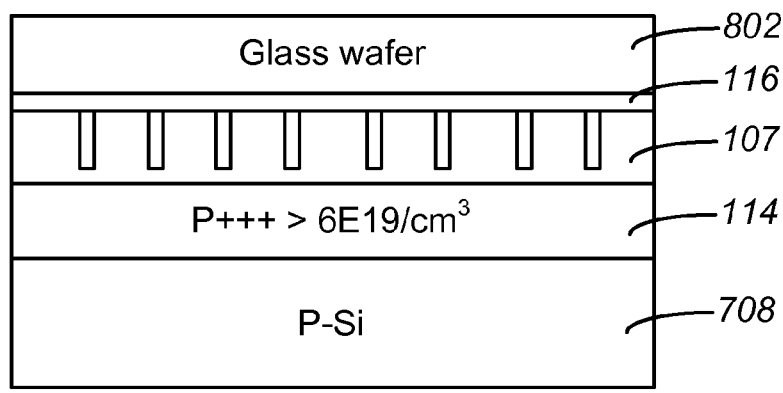

FIGS. 7A-7G are simplified cross-sectional view diagrams illustrating another process flow for forming a vertical device using a heavily doped p-type (110) oriented substrate according to an alternative embodiment of the present invention. First, in FIG. 7A, a heavily boron doped (110) layer 114 (with concentration >$6 \times 10^{19}$ cm$^{-3}$) is epitaxially grown or formed through boron implant on (110) oriented silicon wafer 708. Merely as an example, an epi process can be carried out at 1060° C. with a B$_2$H$_6$ doping species (mixing with H$_2$ at a concentration of 5000 ppm). Alternatively, heavily doped layer 114 may be formed by boron ion implantation. The implant can be of 60 KeV with a dose of $1 \times 10^{16}$ cm$^{-2}$ for half an hour to create a heavily doped silicon layer. After this process, the desired device epi layer 106 is grown as shown in FIG. 7B. The wafer then undergoes the device fabrication process to build the device. In FIG. 7C device layer 107 and metal layer 116 are formed. Device layer 107 can include any vertical devices, which may include trench gate MOSFET or shielded gate trench MOSFET such as described in FIGS. 5A-5H. The finished wafer is then bonded to a support substrate 802, e.g., a glass carrier as shown in FIG. 7D, and ready for substrate transfer.

Figure 7E:
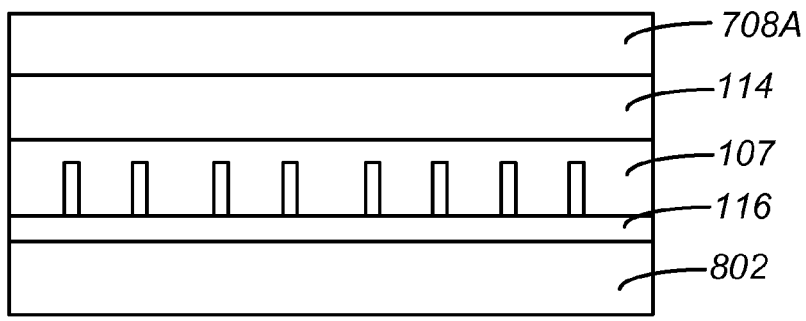
Figure 7F:
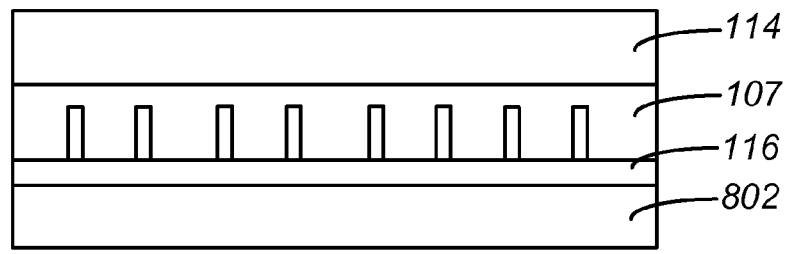
Figure 7G:
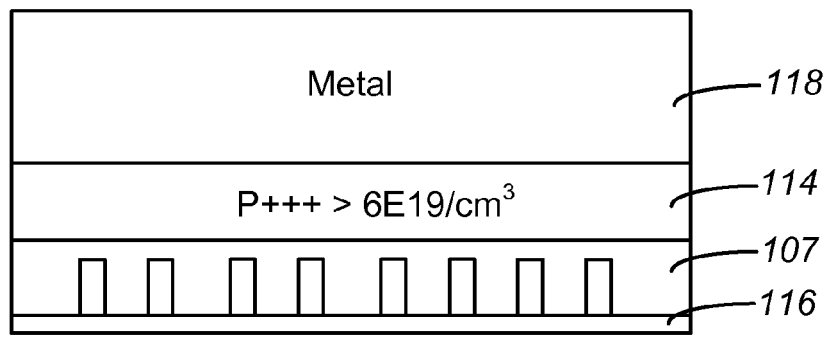

In FIG. 7E, the majority (e.g. 90%) of support substrate silicon wafer 708 is removed through mechanical grinding and acid etching until certain thickness of lightly doped (110) oriented silicon wafer 708A is left, such as 5 µm. The final 5 µm thick silicon 708A is removed by EDP or KOH. Due to the high selectivity of the EDP/KOH etching, the silicon etching will stop at the heavily doped boron silicon 114. In FIG. 7F, this wafer is then ready for the backside metal deposition 118 and supporting metal transferring by removing the glass substrate 802, resulting in the device structure shown in FIG. 7G. The method include certain processes, such as vertical device fabrication, support layer bonding, metal deposition, etc, similar to corresponding processes described above in connection with FIGS. 5A-5H.

As described above, FIGS. 7A-7G are simplified diagrams illustrating an alternative method for forming vertical devices in (110) p-type silicon for enhanced hole mobility which also provides heavily-doped (110) p-type drain regions and metal layers for reducing resistance. As shown, the process is simplified by etch selectivity between heavily doped p-type silicon and lightly doped p-type silicon.

Figure 8A:
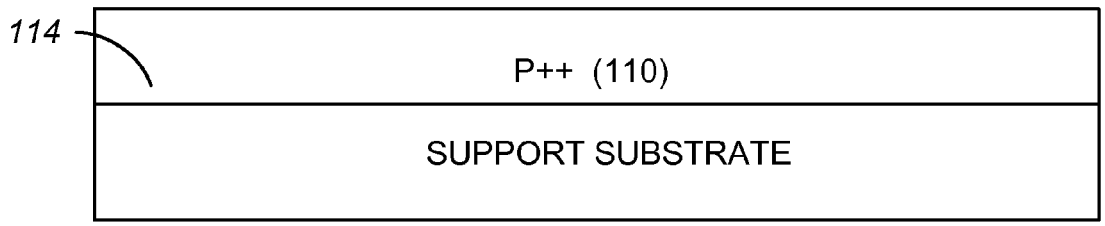
FIGS. 8A-8H and 8J are simplified cross-sectional view diagrams illustrating a simplified process flow for forming a p-type trench gate MOSFET in accordance with an embodiment of the invention.

FIGS. 8A-8J are simplified cross-sectional view diagrams illustrating a simplified process flow for forming a p-type trench gate MOSFET having a vertical (110)/<110> hole conduction path similar to device 100 of FIG. 2 in accordance with an embodiment of the invention. In FIG. 8A, a heavily doped p-type layer 114 is disposed on a support substrate. According to embodiments of the present invention, p-type layer 114 is a single-crystalline layer having (110) crystalline orientation. In a specific embodiment, the support substrate can be a composite of a dielectric layer and a silicon wafer, similar to layers 306 and 308 of FIG. 4F, where layer p-type layer 114 can be formed by the cleaving method illustrated in FIGS. 4A-4F. In another embodiment, the support substrate can be a (110) p-type silicon wafer of FIG. 7A, where the p-type layer 114 can be formed by ion implantation or diffusion.

Figure 8B:
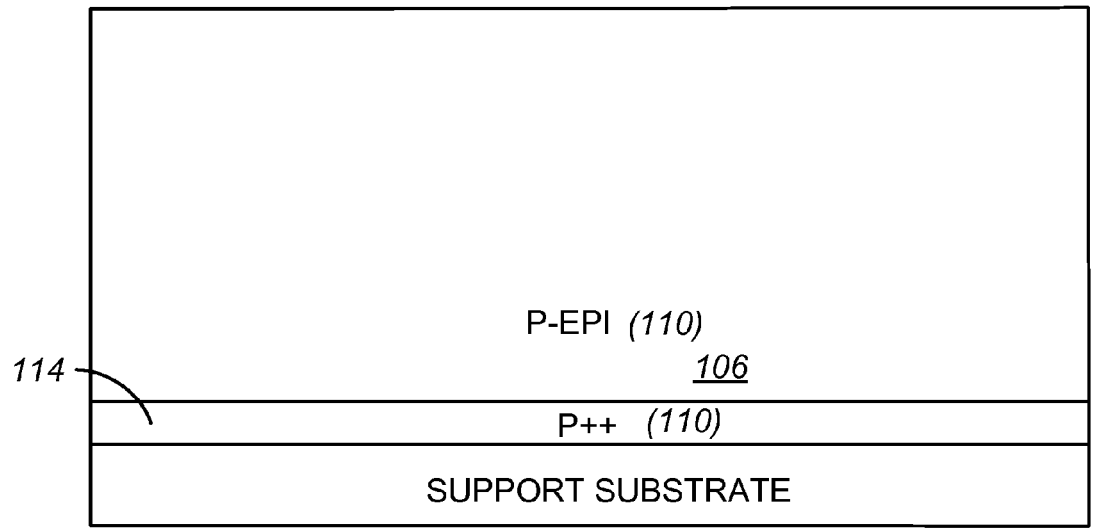
Figure 8C:
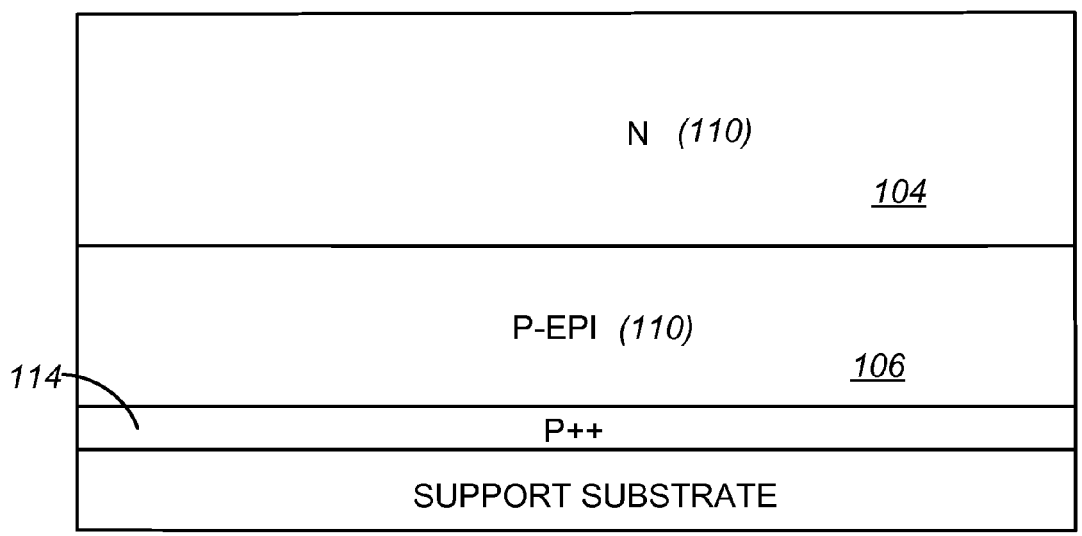

In FIG. 8B, a p-type epitaxial layer 106 having (110) crystal orientation is formed over heavily doped p-type layer 114 using conventional techniques. In FIG. 8C, an n-type body region 104 is formed in epitaxial layer 106 by implanting and diffusing dopants of n-type conductivity into epitaxial layer 106.

Figure 8D:
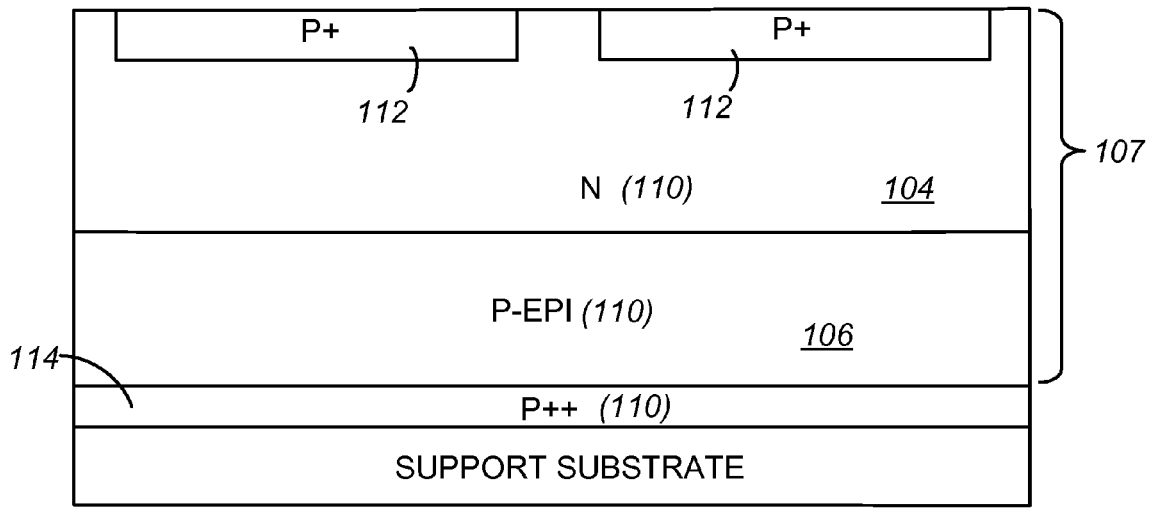
Figure 8E:
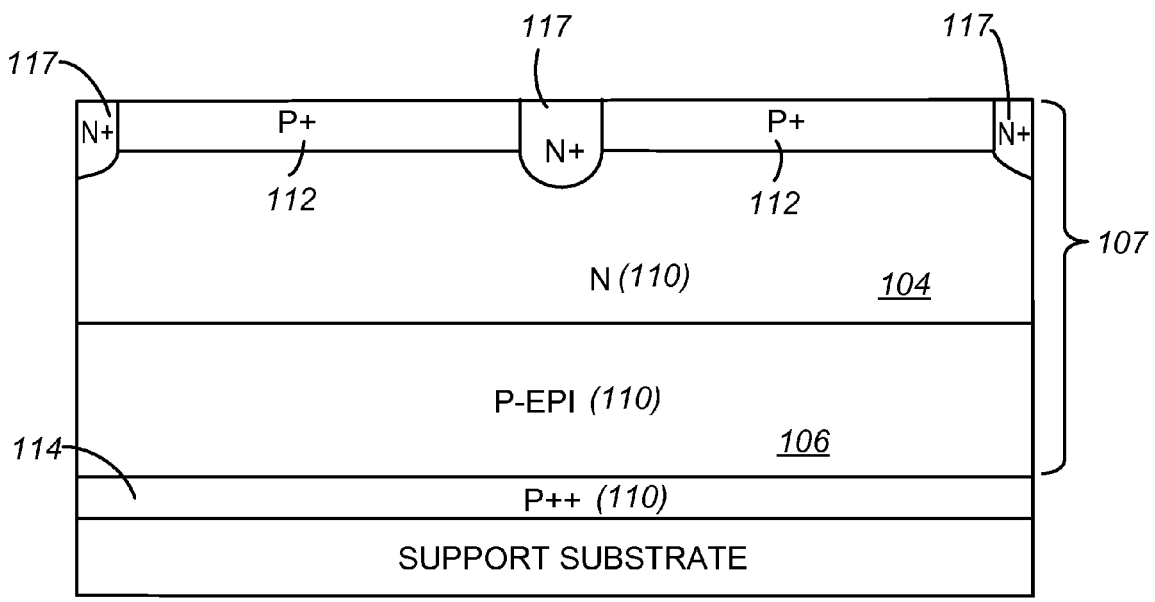

In FIG. 8D, highly doped p-type source regions 112 are formed in body regions 104 using conventional source implant techniques. In FIG. 8E, N-type heavy body regions 117 are also formed using, for example, conventional ion implantation techniques. The dopants in p-type source regions 112 and N-type heavy body regions 117 can be driven in and activated either in the same diffusion process or in separate diffusion steps. Note in this specific embodiment, the high-temperature diffusion processes are carried out before trench formation. In alternative embodiments, the source regions and heavy body regions may be formed after trench formation.

Figure 8F:
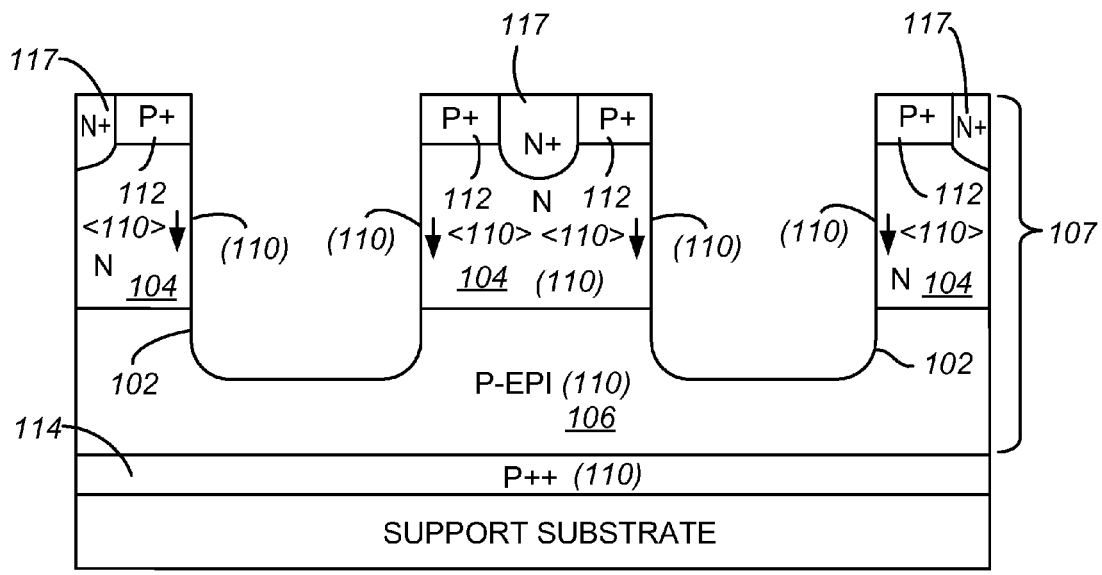

In FIG. 8F, a masking layer (not shown) is formed on top of body region 104 by a conventional method. The masking layer is patterned to define openings through which trenches 102 are formed. A conventional anisotropic silicon etch may be used to etch trenches extending through body region 104 and terminating below the bottom surface of body region 104. As shown in FIG. 8F, sidewalls of trenches 102 have (110) crystalline orientation. Additionally, a channel region is formed along the sidewalls which allow current conduction between source region 112 and drain region along a <110> direction in a (110) crystalline plane. Thus, enhanced hole mobility can be obtained leading to improved performance of the p-type MOSFET.

In a specific embodiment, a hydrogen anneal process can be performed. The hydrogen anneal not only reduces the defect density of the silicon layers but it also causes the corners of trenches 102 to become rounded.

Figure 8G:
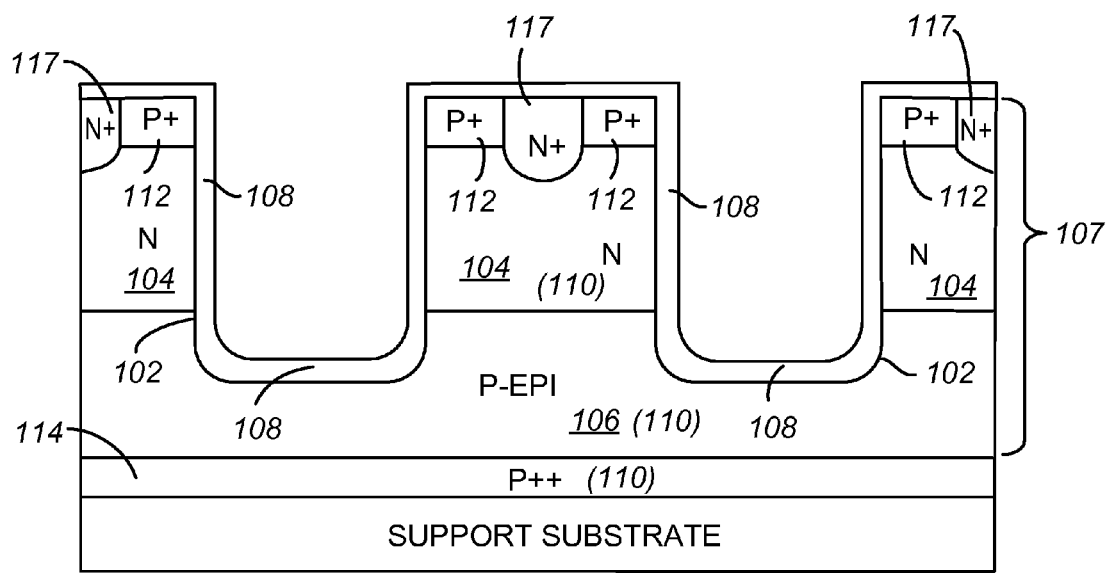

In FIG. 8G, a thin gate dielectric 108 is formed, which lines the sidewalls and bottom of trenches 102. Gate dielectric 108 may be formed by the ALD gate dielectric process described above and includes a high-k dielectric layer overlying a thin interfacial dielectric layer which lines the trench sidewall. According to an embodiment of the present invention, the thin interfacial dielectric layer can be formed by chemical oxide, thermal oxide, or oxynitride having a thickness of about, e.g., 5-10 Å. As described above, the high-k dielectric layer can be formed by an atomic layer deposition (ALD) process at a deposition temperature of about 180-600° C. Depending on the embodiment, the high-k dielectric layer can have a thickness of, e.g., 50-500 Å. In this embodiment, the high-temperature steps such as diffusion of source regions 112 and heavy body regions 117 have already been carried out. Therefore, the gate dielectric 108 avoids any high-temperature processing, which can adversely affect the quality of the gate dielectric formed by the ALD process. With this gate dielectric formation process, gate dielectric 108 is of higher quality compared to thermal gate oxide on (110) silicon surface made by conventional methods.

Figure 8H:
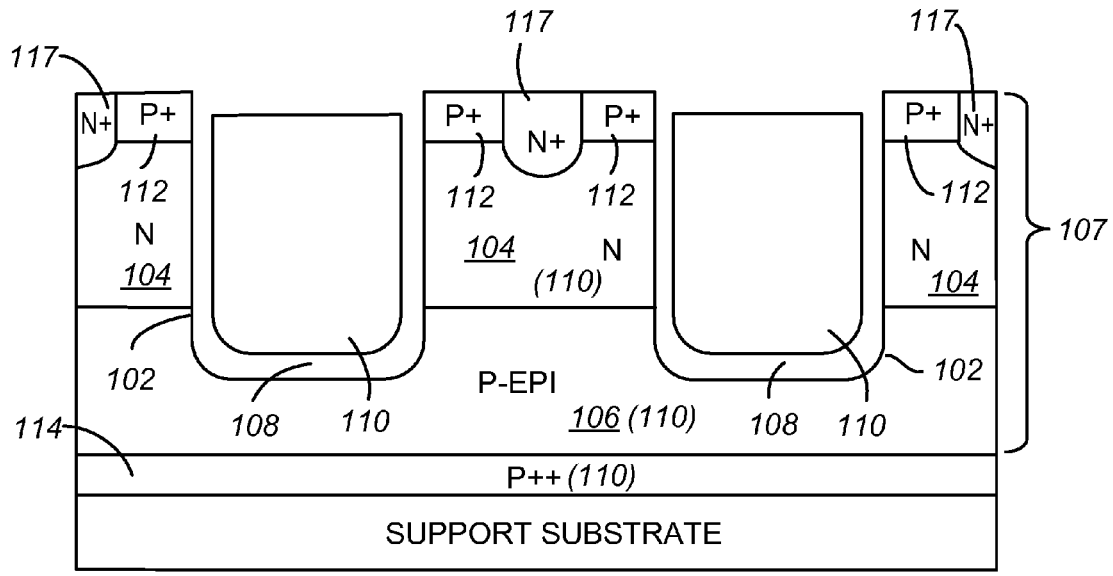
Figure 8J:
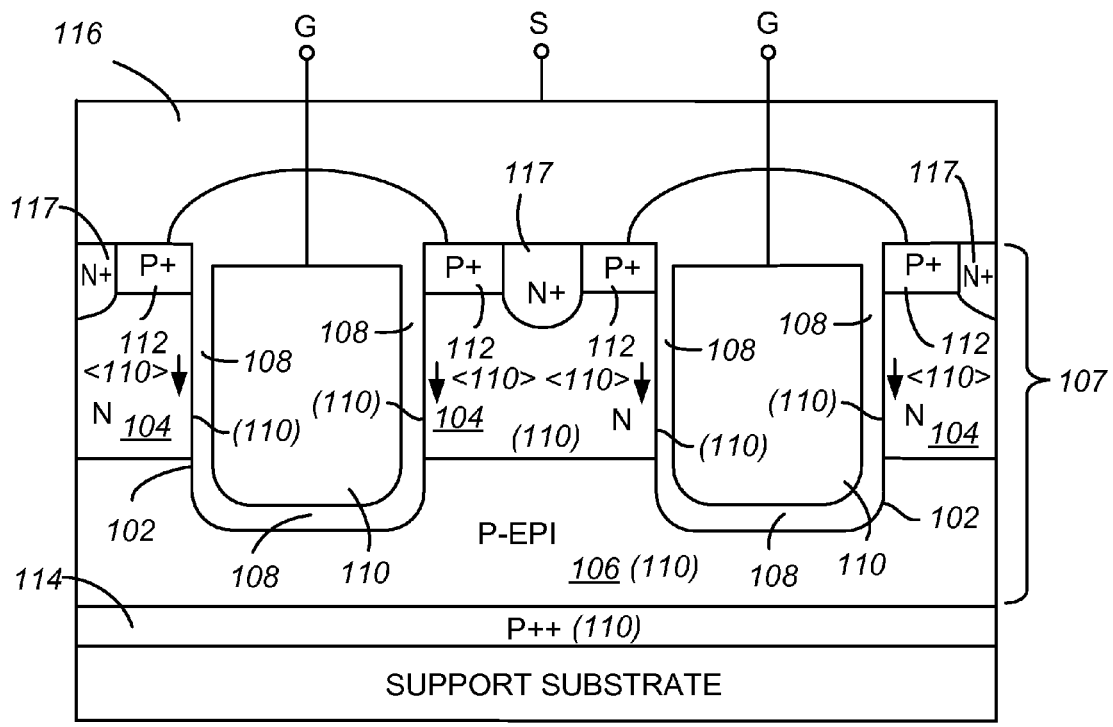

In FIG. 8H, recessed gate electrodes 110 (e.g., comprising polysilicon) is formed in trenches 102 using conventional techniques. The active regions of the field effect transistor are thus formed between source regions 112 and substrate layer (or drain contact) 114 along the sides of each trench 102. In FIG. 8J, recessed gate electrode 110 are covered by a dielectric, and source metal 116 is formed. In subsequent processes, not illustrated, backend processes can be carried out to form the remaining layers and structures such as the interconnect layers and passivation.

Note that the p-type trench gate device structure in FIG. 8J is similar to the device structure in FIG. 5 or FIG. 7C. The process described in FIGS. 5D-5H or FIGS. 7D-7G can be used to remove the support substrate in FIG. 8J and form p-type trench gate MOSFET 100 in FIG. 2. As noted, p-type MOSFET 100 has a thin heavily doped p-type drain layer 114 overlying a metal substrate, a channel conduction path along a <110> direction on a (110) crystalline plane for enhanced hole mobility, and improved gate dielectric on the (110) crystalline surface.

An example of a trench MOSFET process describing various steps before and after the trench formation process module can be found in U.S. patent application Ser. No. 11/140,567, entitled "Structure and Method for Forming a Minimum Pitch Trench-Gate FET with Heavy Body Region," which is hereby incorporated by reference.

Figure 9A:
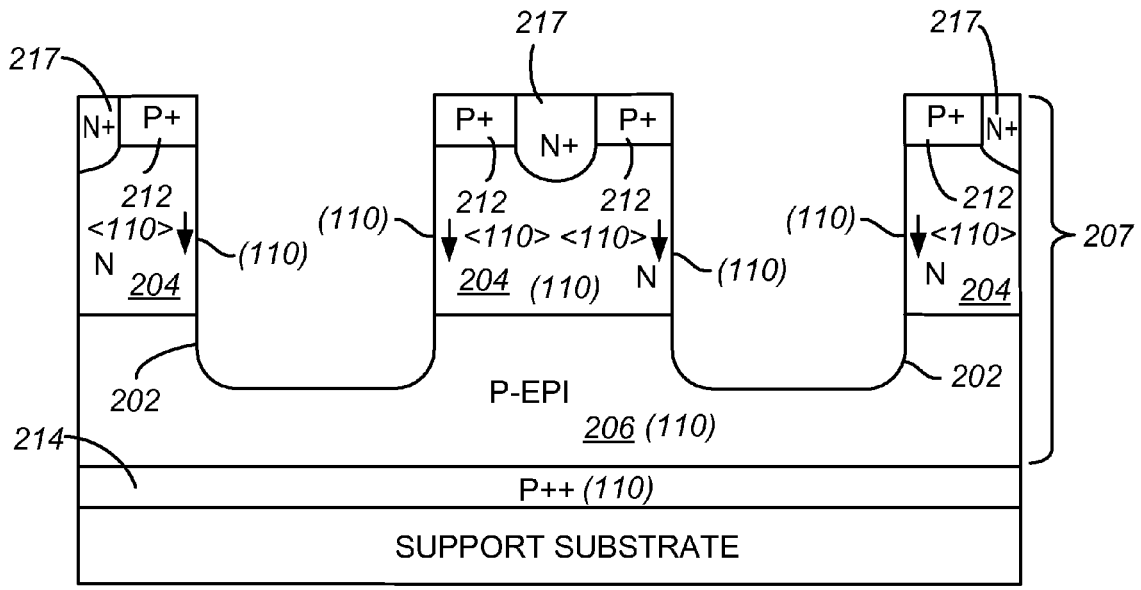
FIGS. 9A-9E are simplified cross-sectional view diagrams illustrating a simplified process flow for forming a p-type shielded gate MOSFET in accordance with an embodiment of the invention.

FIGS. 9A-9E are simplified cross-sectional view diagrams illustrating a simplified process flow for forming a p-type shielded gate MOSFET having a channel conduction path in the (110)/<110> direction in accordance with an embodiment of the invention. As shown FIG. 9A illustrates a device structure similar to that of FIG. 8F, and can be formed using a similar process as described above in FIGS. 8A-8F.

As shown in FIG. 9A, a heavily doped p-type layer 214 is disposed on a support substrate. Heavily doped p-type layer 214 is a single-crystalline layer having (110) crystalline orientation. The support substrate can be a composite of a dielectric layer and a silicon wafer, similar to layers 306 and 308 of FIG. 4F, where layer p-type layer 114 can be formed by the cleaving method illustrated in FIGS. 4A-4F. In another embodiment, the support substrate can be a (110) p-type silicon wafer of FIG. 7A, where the p-type layer 114 can be formed by ion implantation or diffusion.

In FIG. 9A, a drift region is formed by a p-type epitaxial layer 206 having (110) crystal orientation over heavily doped p-type layer 214. FIG. 9A also shows n-type body region 204, drift or epitaxial layer 206, highly doped p-type source regions 212, and N-type heavy body regions 217. As shown, trenches 202 have sidewalls surfaces in the (110) crystalline orientation. Additionally, a channel region is formed along the sidewalls which allow current conduction between a source region 112 to a drain region along a <110> direction in a (110) crystalline plane. As described above, enhanced hole mobility can be obtained leading to improved performance of the p-type MOSFET.

Figure 9B:
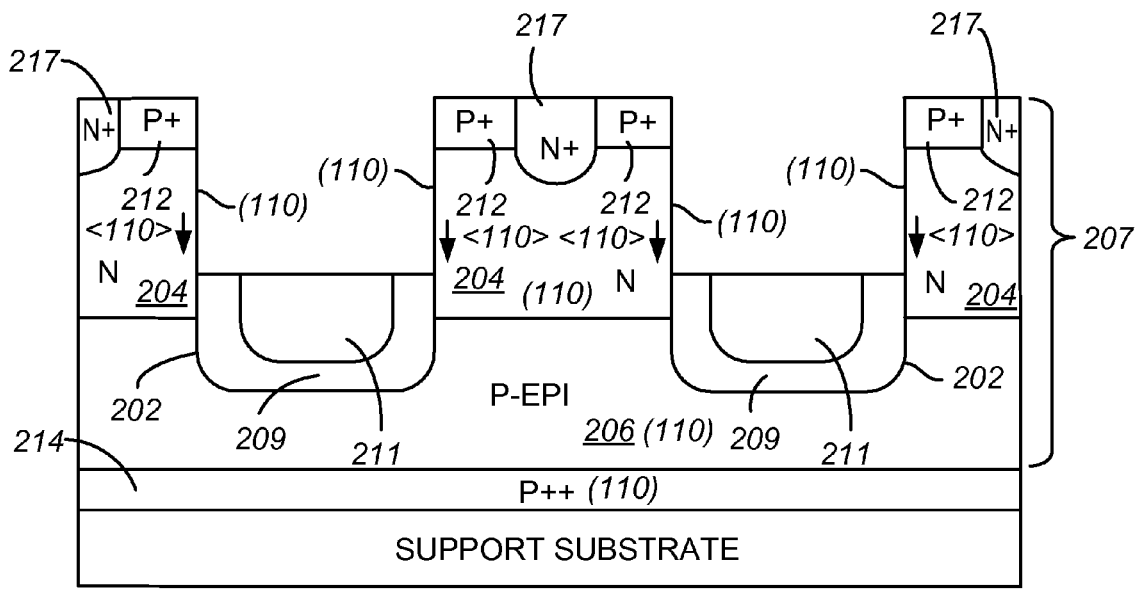

In FIG. 9B, shield dielectric 209 are formed along the sidewalls of trenches 202. Next, shield electrodes 211 are formed in a bottom portion of trenches 202 using known techniques. For example, a conductive material (e.g., comprising doped or undoped polysilicon) is first formed filling the trenches and extending over the mesa regions. The conductive material is recessed deep into trenches 202 to form shield electrode 211 using known techniques. Then, the shield dielectric is removed from along the exposed upper trench sidewalls and over mesa surfaces.

Figure 9C:
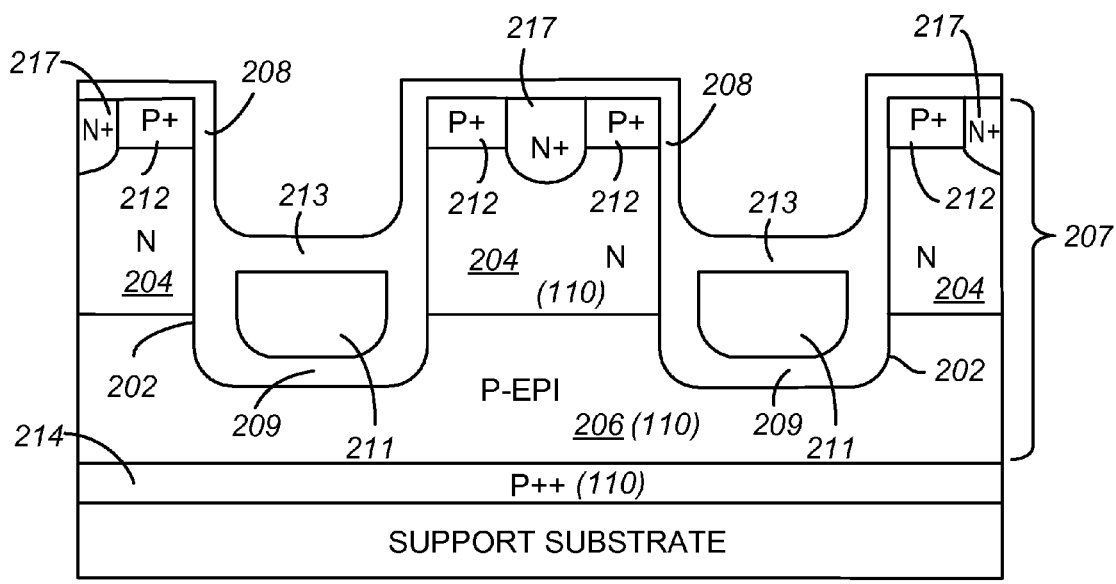

In FIG. 9C, thick inter-electrode dielectric (IED) layers 213 are formed over shield electrodes 211. Next, gate dielectric layer 208 is formed extending along the upper trench sidewalls. In an embodiment, gate dielectric layer 208 can be formed using an ALD process similar to the process described above in connection with FIG. 8G.

Figure 9D:
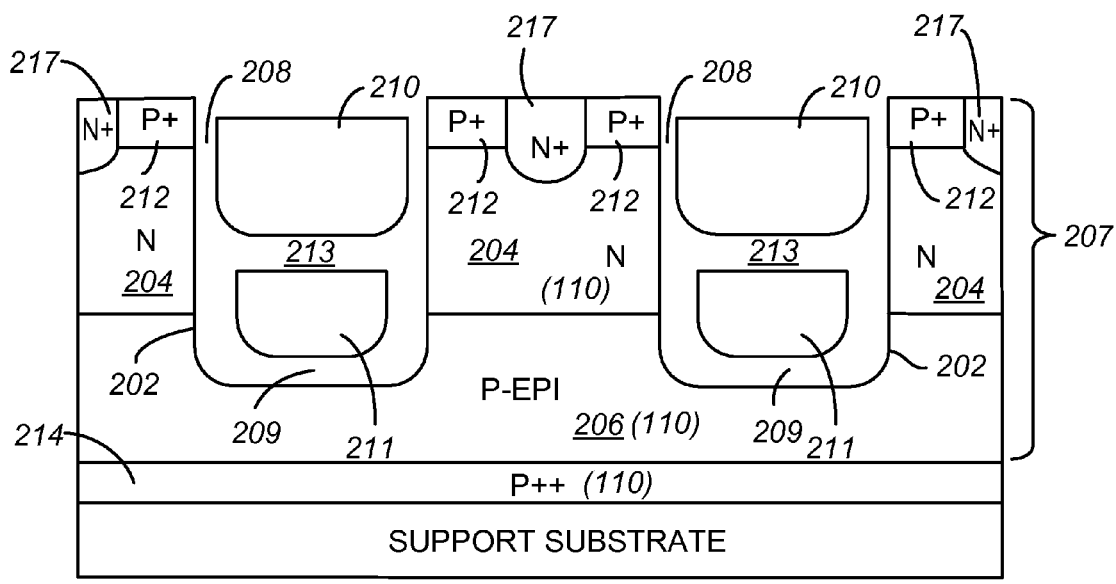
Figure 9E:
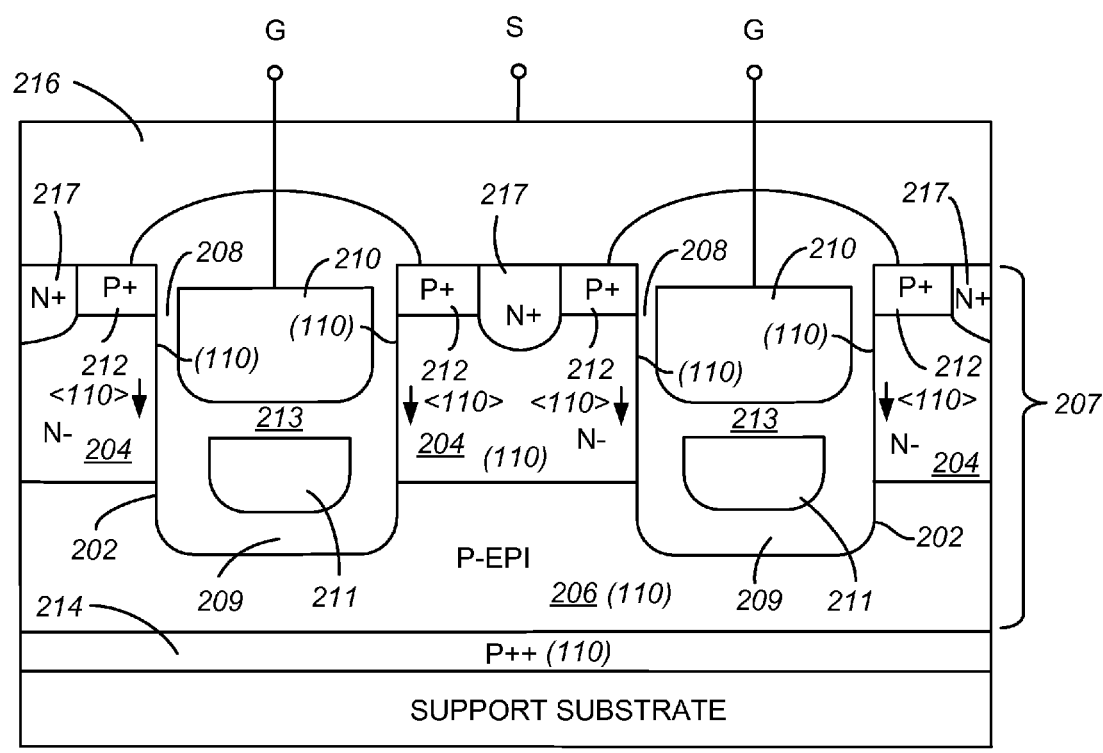

In FIG. 9D, recessed gate electrodes 210 are formed in trenches 202 using known techniques, e.g. polysilicon deposition and etch back. In FIG. 9E, the gate electrodes are covered with a dielectric layer, and then source metal 216 is formed.

Note that the p-type shielded gate device structure in FIG. 9E is similar to the device structure in FIG. 5 or FIG. 7C. The process described in FIGS. 5D-5H or FIGS. 7D-7G can be used to remove the support substrate in FIG. 9E and form a p-type shielded gate MOSFET similar to device 200 in FIG. 3. As noted, p-type MOSFET 200 has a thin heavily doped p-type drain layer 214 overlying a metal substrate, a channel conduction path along a <110> direction on a (110) crystalline plane for enhanced hole mobility, and improved gate dielectric on the (110) crystalline surface.

According to embodiments of the present invention, the shield electrode in a shielded gate FETs can be floating (i.e., is electrically unbiased), biased to the source potential (e.g., ground potential), or biased to the same potential as the gate electrode. The electrical contact between the gate and shield electrodes may be formed in any non-active region, such as in the termination or edge regions of the die.

While the above includes descriptions of specific embodiments of the present invention, various modifications, variations, and alternatives may be employed. For example, although silicon is given as an example of a substrate material, other materials may be used. The invention is illustrated using trench MOSFETs, but it could easily be applied to other trench-gate structures such as IGBTs by merely reversing the polarity of the substrate. Similarly, implantation is given as an example of introducing dopants, but other doping methods, such as a gas or topical dopant source may be used to provide dopants for diffusion, depending on the appropriate mask being used. The process sequences depicted are for p-channel FETs, but modifying these process sequences to form N-channel FETs would be obvious to one skilled in the art in view of this disclosure. Also, while some trenches discussed above are shown to terminate within the epitaxial layer, the trenches may alternatively extend through the epitaxial layer and terminate within the substrate region. Further, the invention is not limited to trench gate structures and may be used in forming other devices such as planar gate vertical MOSFETs, planar gate vertical IGBTs, diodes, and various types of thyristors.

Figure 10:
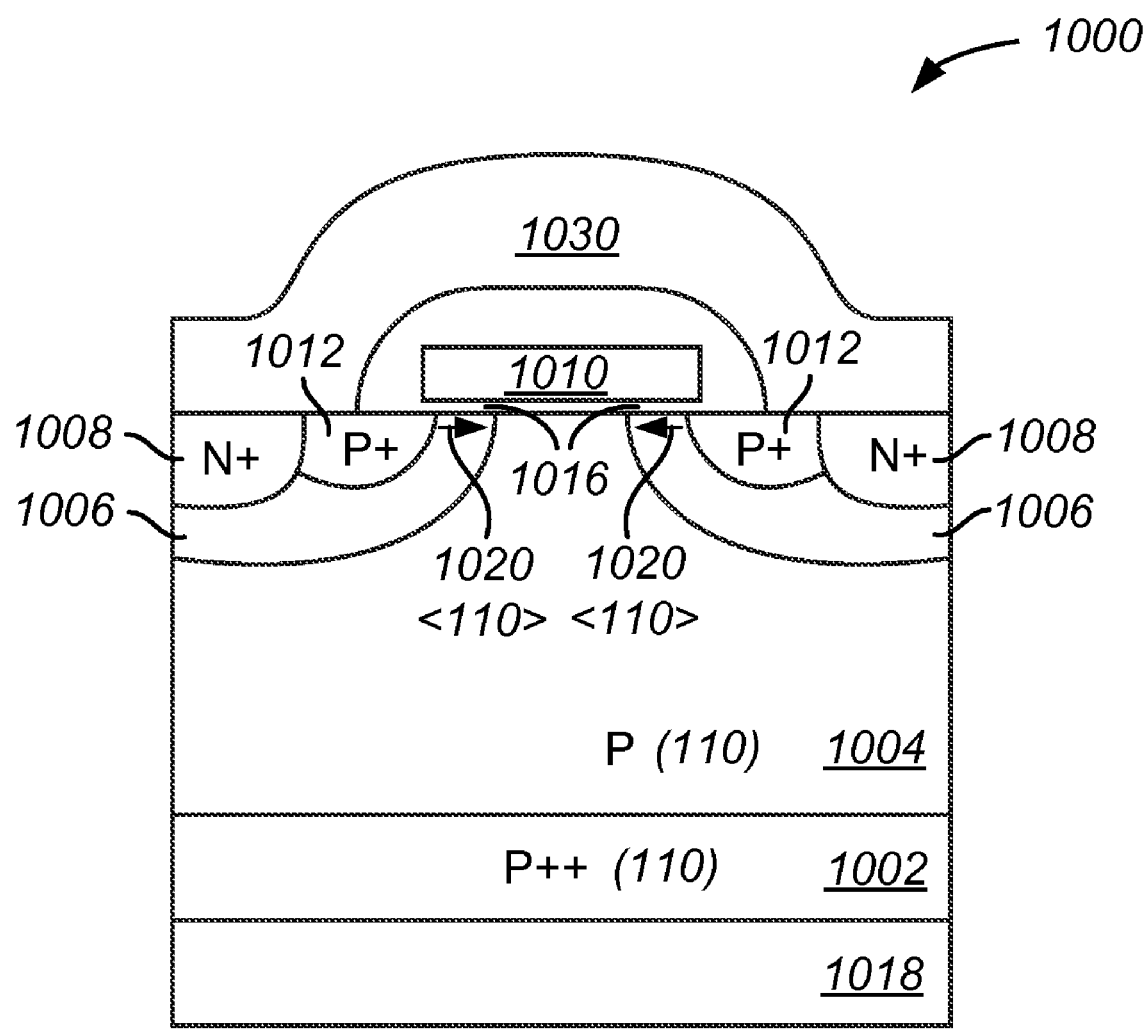
FIG. 10 is a simplified cross-sectional view diagram illustrating a p-type planar power MOSFET in accordance with an embodiment of the invention.

Merely as an example, FIG. 10 is a simplified cross-sectional view diagram illustrating a p-type planar power MOSFET 1000 in accordance with an embodiment of the invention. The p-type planar power MOSFET 1000 has conduction channels 1020 in the <110> direction along a (110) plane and a high dielectric constant gate dielectric 1016. The enhanced hole mobility in the <110> direction along the (110) plane coupled with improved quality of the gate dielectric lead to better device performance.

As shown in FIG. 10, a lightly doped p-type (110) drift region 1004 extends over a thin highly doped p-type (110) semiconductor region 1002 which is disposed over a metal substrate 1018. N-type body regions (or well region) 1006 are located in upper portions of drift region 1004. Highly doped p-type source regions 1012 are located in upper parts of body regions 1006, and heavy body contact regions 1008 are located in body regions 1006 adjacent source regions 1012.

In FIG. 10, a gate 1010 extends over a surface of body regions 1006 and overlaps source regions 1012 and drift region 1004. Gate 1018 is insulated from its underlying regions by a gate dielectric 1016. The portion of body region 1006 directly beneath gate 1018 forms the MOSFET channel region 1020. In embodiments of the invention, the surface of the channel region has the (110) crystalline orientation. Channel regions 1020 provide current conduction paths in the <110> direction along a (110) plane where the hole mobility is enhanced. Additionally, the gate dielectric 1016 can be formed using method for forming high k dielectrics discussed above for high quality dielectrics on a (110) silicon surface.

In FIG. 10, a source conductor 1030 electrically contacts source regions 1012 and heavy body regions 1008, and the metal substrate 1018 contacts highly doped p-type (110) semiconductor region 1002 which functions as a drain region. The source and drain conductors may be formed with metal, such as copper, aluminum, etc. In planar MOSFET 1000, the top and the bottom metal layers provide external contacts for the current conduction in the <110> direction.

As noted above, it is desirable to have a thin layer of the highly doped p-type (110) semiconductor region 1002 to reduce resistance. However, heavily doped p-type (110) substrates are not generally available commercially. According to embodiments of the present invention, the drift region 1004 and its underlying highly doped semiconductor region 1002 can be formed using the various methods discussed above. In one embodiment, both drift region 1004 and its underlying highly doped semiconductor region 1002 are epitaxial layers. In another embodiment, the highly doped semiconductor region 1002 is an P+substrate can be formed by ion implantation into a lightly doped (110) p-type substrate. Various substrate transfer processes can be used to obtain the thin layer of the highly doped p-type (110) semiconductor region 1002. Some of the substrate transfer processes are described above in connections with FIGS. 4A-4F, 5A-5H, 6, and 7A-7G.

While certain embodiments of the invention have been illustrated and described, those skilled in the art with access to the present teachings will recognize that the invention is not limited to these embodiments only. Numerous modifications, changes, variations, substitutions, and equivalents will be apparent to those skilled in the art. Accordingly, it is to be understood that the invention is intended to cover all variations, modifications, and equivalents within the scope of the following claims.

What is claimed is:

1. A semiconductor device having a heavily doped p-type (110) semiconductor layer overlying a metal substrate, comprising:
   a first metal layer;
   a first p-type semiconductor layer overlying the first metal layer, the first p-type semiconductor layer being heavily doped and having a surface crystal orientating of (110), the first p-type semiconductor layer being characterized by a first conductivity;
   a second p-type semiconductor layer overlying the first p-type semiconductor layer, the second semiconductor layer having a surface crystal orientation of (110) and a second conductivity that is lower than the first conductivity;
   a gate dielectric layer including a high dielectric constant material, the gate dielectric layer lining a (110) crystalline plane in the second p-type semiconductor layer; and
   a second metal layer overlying the second p-type semiconductor layer,
   wherein a current conduction between the first metal layer to the second metal layer is characterized by a hole mobility along a <110> crystalline orientation and on (110) crystalline plane.

2. The device of claim 1 wherein the high dielectric constant material has a dielectric constant higher than that of a silicon dioxide.

3. The device of claim 1 wherein the high dielectric constant material has a thickness of about 5 nm to about 50 nm.

4. The device of claim 1 wherein the gate dielectric comprises a high dielectric constant material formed using an atomic layer deposition (ALD).

5. The device of claim 1 wherein the high dielectric constant material includes $HfO_2$.

6. The device of claim 1 wherein the gate dielectric layer includes a thin interfacial dielectric layer underlying the high dielectric constant material.

7. The device of claim 1 wherein the thin interfacial dielectric layer has a thickness of about 5-10 Å.

8. The device of claim 1 wherein the gate dielectric layer includes a thin oxide or oxynitride layer underlying the high dielectric constant material.

9. The device of claim 1 wherein the first p-type semiconductor layer has a thickness of not more than about 3 um.

10. The device of claim 1 wherein the first p-type semiconductor layer is characterized by a doping concentration of $1 \times 10^{17}$ cm$^{-3}$ or higher.

11. The device of claim 1 wherein the first p-type semiconductor layer is characterized by a doping concentration higher than $6 \times 10^{19}$ cm$^{-3}$.

12. The device of claim 1 wherein a thickness of the first p-type semiconductor layer is between approximately 0.5 um to approximately 3 um.

13. The device of claim 1 wherein each of the first and second p-type semiconductor layers is an epitaxial layer.

14. The device of claim 1 wherein the bottom metal layer has sufficient thickness for supporting the vertical semiconductor device.

15. The semiconductor device of claim 1 wherein the semiconductor device comprises a trench gate MOSFET, the trench gate MOSFET further comprising:
   a trench extending into the second p-type semiconductor region;

a channel region adjacent a trench sidewall along a (110) crystalline plane to allow a current conduction in a <110> direction, the gate dielectric layer lining the trench side wall adjacent the channel region;

a gate electrode over the gate dielectric in the trench;

p-type source regions flanking each side of the gate electrode in the trench;

a p-type drift region;

an N-type body region extending over the drift region; and a p-type drain region including at least a portion of the heavily doped first p-type semiconductor layer.

16. The semiconductor device of claim 1 wherein the semiconductor device comprises a shielded gate trench MOSFET, the shielded gate trench MOSFET further comprising:

a trench extending into the second p-type semiconductor layer;

a shield dielectric lining sidewalls and a bottom surface of the trench;

a shield electrode in a lower portion of the trench, the shield electrode being insulated from the second semiconductor layer by the shield dielectric;

an inter-electrode dielectric overlying the shield electrode;

a channel region adjacent a trench sidewall along a (110) crystalline plane to allow a current conduction in a <110> direction, the gate dielectric layer lining the trench side wall adjacent the channel region; and a gate electrode in an upper portion of the trench over the inter-electrode dielectric, the gate electrode being insulated from the second p-type semiconductor layer by the gate dielectric.

17. The semiconductor device of claim 16 wherein the second p-type semiconductor layer comprises:

a p-type drift region;

an N-type body region extending over the drift region; and p-type source regions in the body region adjacent to the trench.

18. The semiconductor device of claim 1 wherein the semiconductor device comprises a planar MOSFET device, the planar MOSFET further comprising:

a drain region including at least a portion of the first p-type semiconductor layer;

a drift region including at least a portion of the lightly doped p-type (110) layer;

an N-type well region in an upper portion of the drift region, a surface portion of the N-type well region being configured to provide a current conduction path along a <110> direction in an (110) plane;

a heavily doped p-type source region in the N-type well region, a surface portion of the N-type well region between the source region and the drift region being configured as the channel region; and a gate electrode overlying the gate dielectric which overlies the channel region.

19. A vertical trench gate MOSFET device formed in a (110) substrate, comprising:

a bottom metal layer;

a heavily-doped (110) p-type semiconductor layer overlying the bottom metal layer;

a lightly-doped (110) p-type semiconductor layer overlying heavily-doped (110) p-type semiconductor layer;

an N-type body region in the lightly-doped (110) p-type semiconductor layer; and a trench extending through the body region and into a bottom portion of the lightly-doped (110) p-type semiconductor layer underlying the body region;

a channel region adjacent a trench sidewall along a (110) crystalline plane to allow a current conduction in a <110> direction, a gate dielectric layer having a high dielectric constant material lining the trench sidewall adjacent the channel region;

a gate electrode over the gate dielectric in the trench;

p-type source regions flanking each side of the gate electrode in the trench;

a p-type drain region including at least a portion of the heavily doped (110) p-type semiconductor layer; and a top metal layer overlying the lightly-doped (110) p-type semiconductor layer, the top metal layer being coupled to the source regions and the body region; and wherein the first and the second metal layers provide external contacts for the current conduction in the <110> direction.

20. The device of claim 19 wherein the heavily doped (110) p-type semiconductor layer is characterized by a doping concentration of $1 \times 10^{17}$ cm$^{-3}$ or higher.

21. The device of claim 19 wherein the heavily doped (110) p-type semiconductor layer is characterized by a doping concentration higher than $6 \times 10^{19}$ cm$^{-3}$.

22. A vertical shielded gate trench MOSFET device formed in a (110) substrate, comprising:

a bottom metal layer;

a first p-type semiconductor layer overlying the bottom metal layer, the first p-type semiconductor layer being characterized by a surface crystal orientating of (110) and a first conductivity, the first p-type semiconductor layer being heavily doped;

a second p-type semiconductor layer having a surface crystal orientation of (110) and overlying the first p-type semiconductor layer, the second p-type semiconductor layer being characterized by a lower conductivity than the first conductivity;

an N-type body region in the second p-type semiconductor layer;

a trench extending through the body region and into a bottom portion of the second p-type semiconductor layer underlying the body region;

a shield dielectric lining sidewalls and a bottom surface of the trench, the shield dielectric including a first shield oxide layer;

a shield electrode in a lower portion of the trench, the shield electrode being insulated from the semiconductor region by the shield dielectric;

an inter-electrode dielectric overlying the shield electrode;

a channel region adjacent a trench sidewall along a (110) crystalline plane to allow a current conduction in a <110> direction, a gate dielectric layer having a high dielectric constant material lining the trench sidewall adjacent the channel region;

a gate electrode in an upper portion of the trench over the inter-electrode dielectric, the gate electrode being insulated from the semiconductor region by the gate dielectric;

p-type source regions flanking each side of the gate electrode in the trench;

a p-type drain region including at least a portion of the heavily doped (110) p-type semiconductor layer; and a top metal layer overlying the second p-type semiconductor layer, the top metal layer being coupled to the source regions and the body region, wherein the first and the second metal layers provide external contacts for the current conduction in the <110> direction.

23. The device of claim 22 wherein the first p-type semiconductor layer is characterized by a doping concentration of about $1\times10^{17}$ cm$^{-3}$ or higher.

24. The device of claim 22 wherein the first p-type semiconductor layer is characterized by a doping concentration of about $6\times10^{19}$ cm$^{-3}$ higher.

25. A planar power MOSFET device, the device comprising:
- a bottom metal layer;
- a heavily-doped (110) p-type drain region overlying the bottom metal layer;
- a lightly-doped (110) p-type drift overlying heavily-doped (110) p-type semiconductor layer;
- an N-type well region in an upper portion of the drift region, a surface portion of the N-type well region being configured;
- a heavily doped p-type source region in the N-type well region, a surface portion of the N-type well region between the source region and the drift region being configured as the channel region to provide a current conduction path along a <110> direction in an (110) plane;
- a gate dielectric layer having a high dielectric constant material overlying the channel region; and
- a gate electrode overlying the gate dielectric which overlies the channel region; and
- a top metal layer coupled to the source regions and the body region; and
- wherein the top and the bottom metal layers provide external contacts for the current conduction in the <110> direction.

* * * * *